(12) United States Patent
Yoshida

(10) Patent No.: US 9,087,898 B2
(45) Date of Patent: Jul. 21, 2015

(54) SEMICONDUCTOR DEVICE AND METHOD OF MANUFACTURING SEMICONDUCTOR DEVICE

(71) Applicant: FUJITSU SEMICONDUCTOR LIMITED, Yokohama-shi, Kanagawa (JP)

(72) Inventor: Eiji Yoshida, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 86 days.

(21) Appl. No.: 13/627,183

(22) Filed: Sep. 26, 2012

(65) Prior Publication Data

US 2013/0075743 A1    Mar. 28, 2013

(30) Foreign Application Priority Data

Sep. 28, 2011  (JP) ................. 2011-212483

(51) Int. Cl.
  *H01L 29/78*    (2006.01)
  *H01L 29/06*    (2006.01)
  *H01L 21/762*   (2006.01)
  (Continued)

(52) U.S. Cl.
  CPC ...... *H01L 29/7833* (2013.01); *H01L 21/76229* (2013.01); *H01L 21/76232* (2013.01); *H01L 29/0638* (2013.01); *H01L 21/3081* (2013.01); *H01L 21/743* (2013.01); *H01L 29/665* (2013.01)

(58) Field of Classification Search
  CPC ............ H01L 21/76229; H01L 21/76232; H01L 29/0638; H01L 29/7833; H01L 29/665; H01L 21/3081

USPC ............ 257/66, 341, 371, E21.409; 438/294, 438/149

See application file for complete search history.

(56) References Cited

U.S. PATENT DOCUMENTS 6,147,384 A   11/2000  Chen
6,288,429 B1   9/2001  Iwata et al.
(Continued)

FOREIGN PATENT DOCUMENTS

JP   09-074189 A   3/1997
JP   10-163342 A   6/1998
(Continued)

OTHER PUBLICATIONS

Office Action dated Dec. 24, 2014, issued in corresponding Japanese Patent Application No. 2011-212483, with English translation (5 pages).

*Primary Examiner* — Thinh T Nguyen
(74) *Attorney, Agent, or Firm* — Westerman, Hattori, Daniels & Adrian, LLP

(57) ABSTRACT

A semiconductor device includes a first device isolation insulating film defining a first region, a first conductive layer of a first conductivity type formed in the first region, a semiconductor layer formed above the semiconductor substrate and including a second conductive layer of the first conductivity type connected to the first conductive layer and a third conductive layer of the first conductivity type connected to the first conductive layer, a second device isolation insulating film formed in the semiconductor layer and isolating the second conductive layer and the third conductive layer from each other, a gate insulating film formed above the second conductive layer, and a gate electrode formed above the gate insulating film and electrically connected to the first conductive layer via the third conductive layer.

9 Claims, 25 Drawing Sheets

(51) Int. Cl.
  *H01L 21/74* (2006.01)
  *H01L 21/308* (2006.01)
  *H01L 29/66* (2006.01)

(56) References Cited

U.S. PATENT DOCUMENTS

2005/0280052 A1  12/2005  Holz et al.
2012/0032272 A1* 2/2012  Yoshida et al. ............... 257/369

2012/0146149 A1  6/2012  Momiyama

FOREIGN PATENT DOCUMENTS

| | | |
|---|---|---|
| JP | 11-074522 A | 3/1999 |
| JP | 2002-208696 A | 7/2002 |
| JP | 2003-086794 A | 3/2003 |
| JP | 2004-087671 A | 3/2004 |
| JP | 2006-502573 A | 1/2006 |
| WO | 2011/041109 A1 | 4/2011 |
| WO | 2011/042965 A1 | 4/2011 |

* cited by examiner

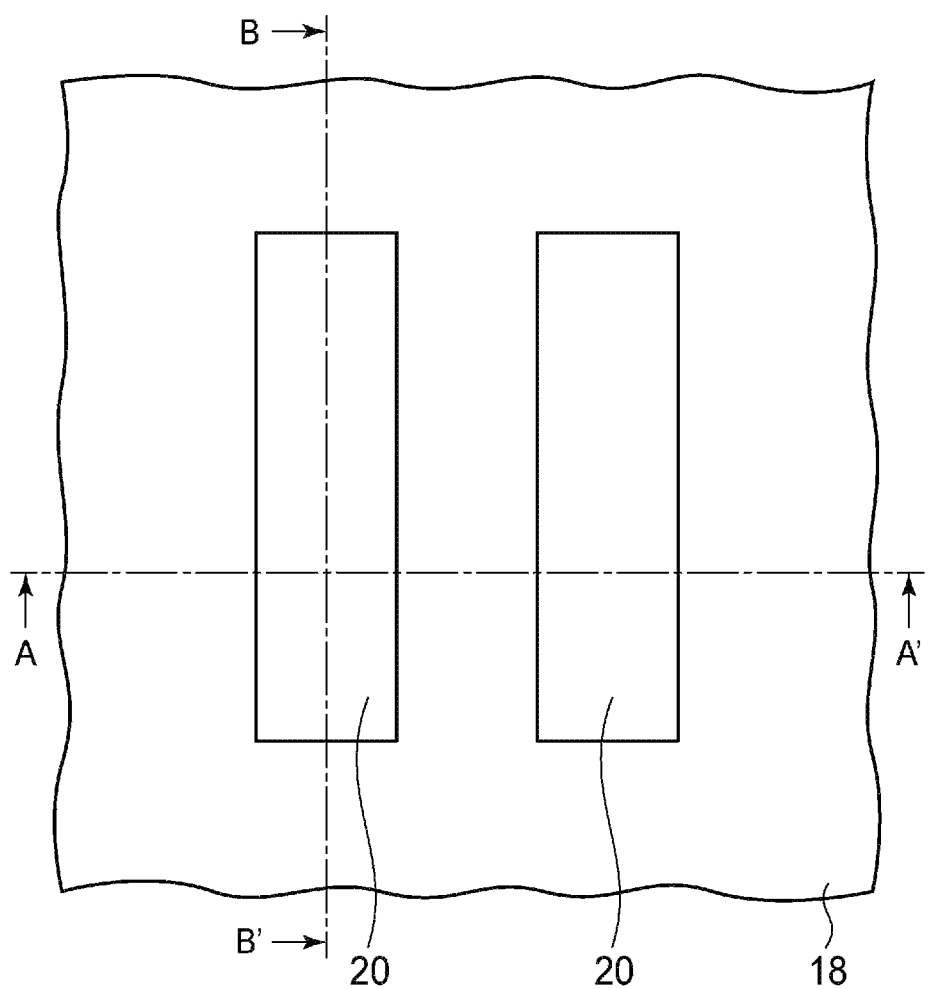

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2011-212483, filed on Sep. 28, 2011, the entire contents of which are incorporated herein by reference.

FIELD

The embodiments discussed herein are related to a semiconductor device and a method of manufacturing a semiconductor device.

BACKGROUND

As a transistor structure for decreasing the power consumption of a semiconductor device, the structure called DTMOS (Dynamic Threshold Voltage MOSFET) is proposed. DTMOS has the transistor structure that the body electrodes of the respective transistors are isolated by using an SOI substrate, and the gate electrode and the body electrode are short-circuited. DTMOS provides a large drive current when the transistor is ON and, when the transistor is OFF, has a threshold voltage relatively higher than when the transistor is ON, whereby the leakage current can be suppressed, and the power consumption can be decreased.

The followings are examples of related: Japanese Laid-open Patent Publication No. 09-074189; Japanese Laid-open Patent Publication No. 11-074522; Japanese Laid-open Patent Publication No. 2002-208696; Japanese Laid-open Patent Publication No. 2004-087671; and Japanese Laid-open Patent Publication No. 2006-502573.

For further speediness and low power consumption of transistors, a structure of semiconductor device which can further decrease the parasitic capacitance, and its manufacturing method are expected.

SUMMARY

According to one aspect of an embodiment, there is provided a semiconductor device including a first device isolation insulating film defining a first region in a semiconductor substrate, a first conductive layer of a first conductivity type formed in the first region of the semiconductor substrate, a semiconductor layer formed above the semiconductor substrate and including a second conductive layer of the first conductivity type formed in a second region, which is a first part of the first region, connected to the first conductive layer, and a third conductive layer of the first conductivity type in a third region, which is a second part of the first region, connected to the first conductive layer, a second device isolation insulating film formed in the semiconductor layer and isolating the second conductive layer and the third conductive layer from each other, a gate insulating film formed above the second conductive layer, and a gate electrode formed above the gate insulating film and electrically connected to the first conductive layer via the third conductive layer.

According to another aspect of an embodiment, there is provided a semiconductor device including a first device isolation insulating film defining a first region and a second region in a semiconductor substrate, a first conductive layer of a first conductivity type formed in the first region of the semiconductor substrate and being shallower than a bottom of the first device isolation insulating film, a second conductive layer of the first conductivity type formed in the second region of the semiconductor substrate and being shallower than the bottom of the first device isolation insulating film, a third conductive layer of a second conductivity type formed in the semiconductor substrate below the first conductive layer and the second conductive layer and being deeper than the bottom of the first device isolation insulating film, a semiconductor layer formed above the semiconductor substrate and including a fourth conductive layer of the first conductivity type formed in a third region, which is a first part of the first region, connected to the first conductive layer, a fifth conductive layer of the first conductivity type formed in a fourth region, which is a second part of the second region, connected to the second conductive layer, a sixth conductive layer of the first conductivity type formed in a fifth region, which is a third part of the first region, connected to the first conductive layer, a seventh conductive layer of the first conductivity type formed in a sixth region, which is a fourth part of the second region, connected to the second conductive layer, and an eighth conductive layer of the second conductivity type formed in a seventh region between the third region and the fourth region in contact with the first device isolation insulating film, a second device isolation insulating film formed in the semiconductor layer and isolating the second conductive layer, the third conductive layer and the sixth conductive layer and the fourth conductive layer, and isolating the second conductive layer, the third conductive layer and the sixth conductive layer and the fifth conductive layer, a first gate insulating film formed above the second conductive layer, a second gate insulating film formed above the third conductive layer, a first gate electrode formed above the first gate insulating film and electrically connected to the first conductive layer via the fourth conductive layer, and a second gate electrode formed above the second gate insulating film and electrically connected to the second conductive layer via the fifth conductive layer.

According to further another aspect of an embodiment, there is provided a method of manufacturing a semiconductor device including forming, in a semiconductor substrate, a first device isolation insulating film defining a first region, forming a semiconductor layer above the semiconductor substrate with the first device isolation insulating film formed in, forming, in the semiconductor layer, a second device isolation insulating film defining a second region containing a first part of the first region, and a third region containing a second part of the first region, forming, in the semiconductor substrate and the semiconductor layer, a first well of a first conductivity type which is deeper than a bottom of the second device isolation insulating film and shallower than a bottom of the first device isolation insulating film, forming a gate insulating film above the second region of the semiconductor layer, and forming, above the gate insulating film, a gate electrode electrically connected to the first well via the third region of the semiconductor layer.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3, 5, 7, 10, 12, 14, 16, 18, 20 and 23 are plan views illustrating a method of manufacturing the semiconductor device according to the embodiment;

DESCRIPTION OF EMBODIMENTS

A semiconductor device and a method of manufacturing a semiconductor device according to an embodiment will be described with reference to FIGS. 1 to 24B.

Figure 1:
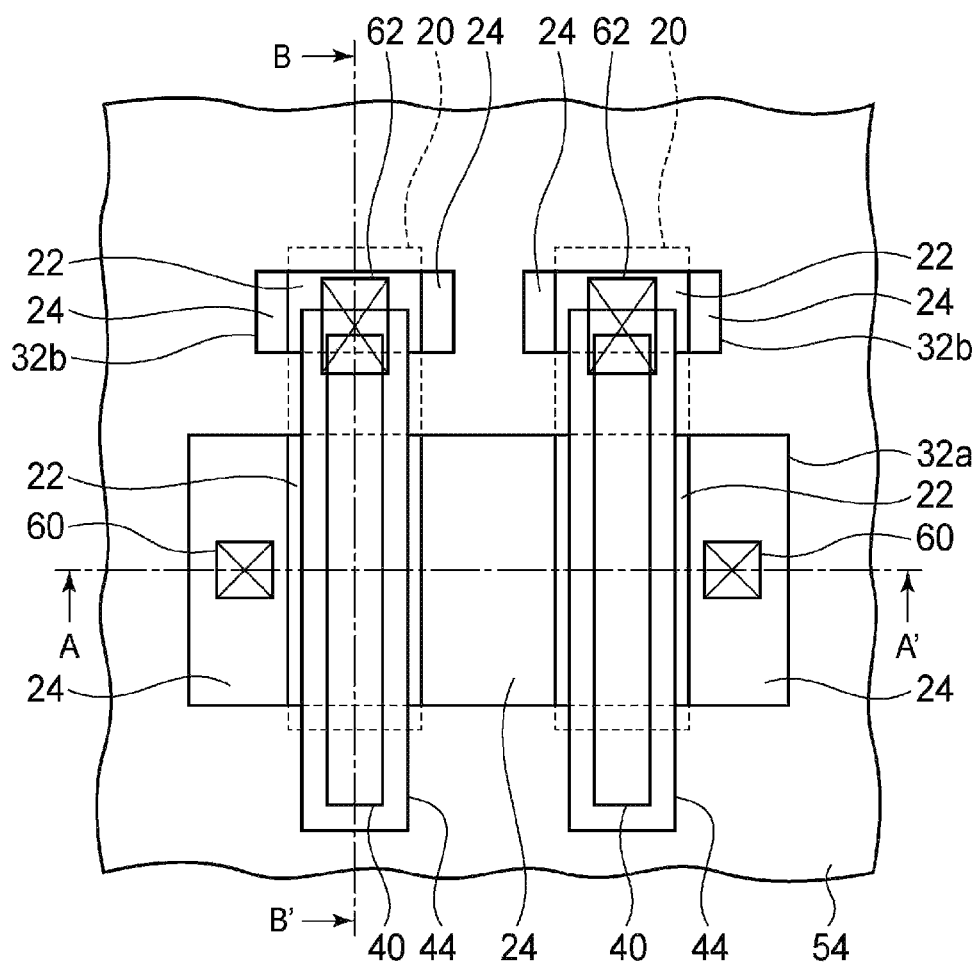
FIG. 1 is a plan view illustrating a structure of a semiconductor device according to an embodiment.
Figure 2A:
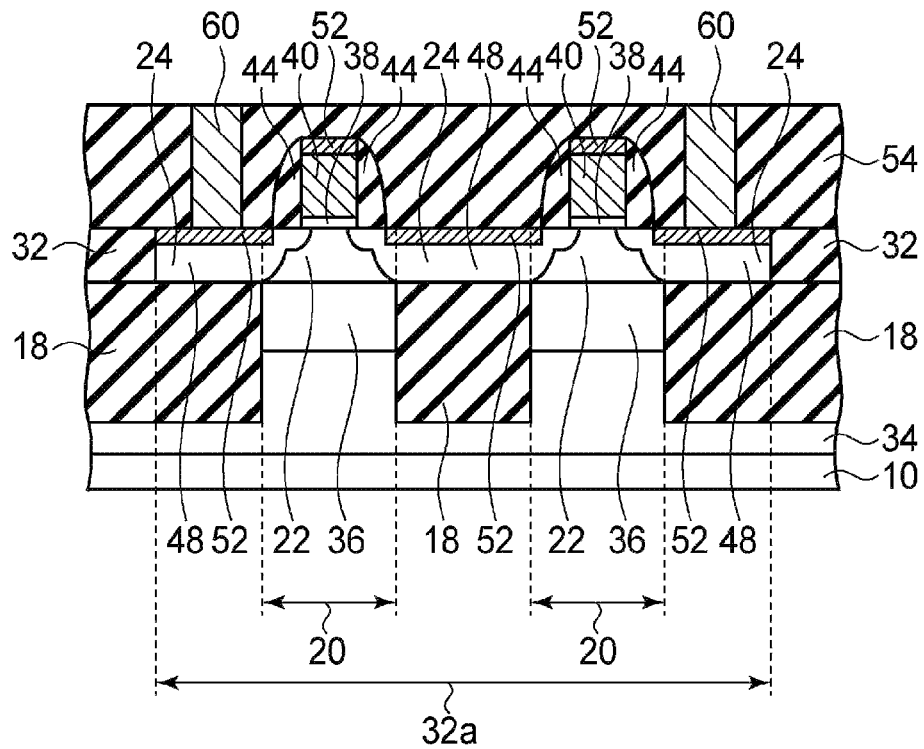
FIGS. 2A and 2B are diagrammatic cross-sectional views illustrating the structure of the semiconductor device according to the embodiment.
Figure 2B:
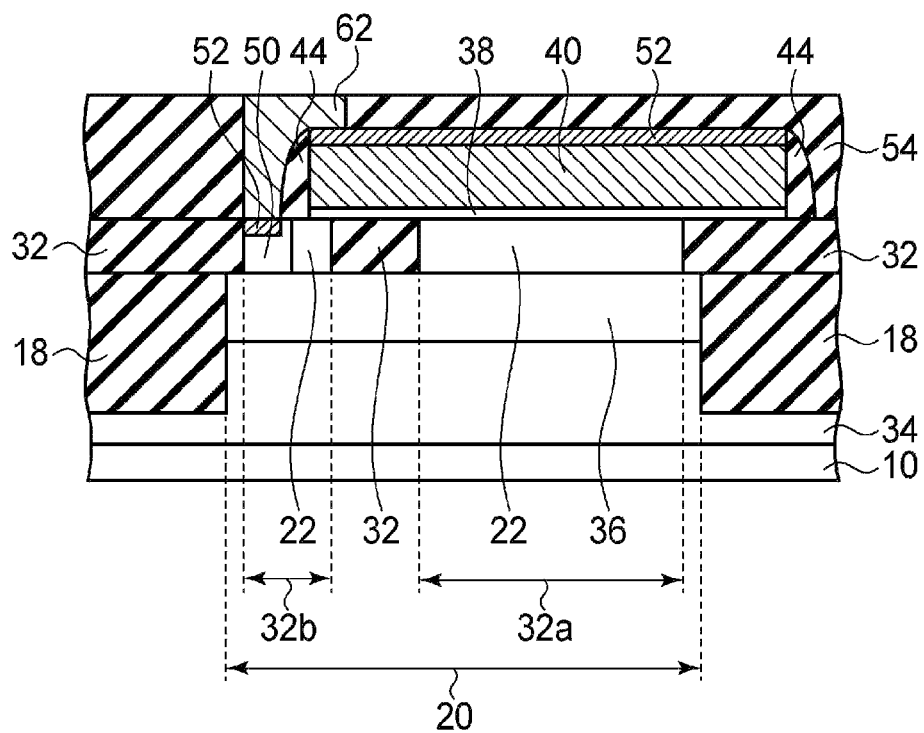

FIG. 1 is a plan view illustrating a structure of a semiconductor device according to the present embodiment. FIGS. 2A and 2B are diagrammatic cross-sectional views illustrating the structure of the semiconductor device according to the present embodiment. FIGS. 3, 5, 7, 10, 12, 14, 16, 18, 20 and 23 are plan views illustrating a method of manufacturing the semiconductor device according to the present embodiment. FIGS. 4A, 4B, 6A, 6B, 8A, 8B, 9A, 9B, 11A, 11B, 13A, 13B, 15A, 15B, 17A, 17B, 19A, 19B, 21A, 21B, 22A, 22B, 24A and 24B are diagrammatic cross-sectional views illustrating the method of manufacturing the semiconductor device according to the present embodiment.

First, the structure of the semiconductor device according to the present embodiment will be described with reference to FIGS. 1 to 2B. FIG. 2A is the A-A' line cross-sectional view of FIG. 1, and FIG. 2B is the B-B' line cross-sectional view of FIG. 1.

A device isolation insulating film 18 defining active regions 20 is formed in a silicon substrate 10. The active regions 20 are regions for body regions which are formed from the channel regions of the transistors to the body contact regions Silicon films 22, 24 are formed above the silicon substrate 10 with the device isolation insulating film 18 formed on. The silicon film 22 is a single crystalline silicon film epitaxially grown on the silicon substrate 10. The silicon film 24 is a polycrystalline silicon film grown on the device isolation insulating film 18. A device isolation insulating film 32 defining active regions 32a, 32b is formed in the silicon films 22, 24. The active region 32a is the region where the channel regions and the source/drain regions 48 of the transistors are formed and the channel regions are connected to parts of the active regions 20. The active regions 32b are the regions where the body contact regions are formed and are connected to other parts of the active regions 20.

An n-well 34 deeper than the bottom of the device isolation insulating film 18 is formed in the silicon substrate 10. P-wells 36 are formed in regions deeper than the bottom of the device isolation insulating film 32 and shallower than the bottom of the device isolation insulating film 18. Thus, the p-wells 36 are isolated from the rest region of the silicon substrate 10 by the n-well 34.

In the specification of the present application, the inner wells (the p-wells 36 of the double well) are often described by being divided in a conductive layer formed in a surface portion of the silicon substrate 10, a conductive layer formed in the active region 32a and a conductive layer formed in the active regions 32b. Also the outer well (the n-well 34) of the double well is often called a conductive layer.

Gate electrodes 40 are formed above the active region 32a with a gate insulating film 38 interposed therebetween. In the active region 32a on both sides of the gate electrodes 40, the source/drain regions 48 are formed. In the specification of the present application, the source/drain regions are often called conductive layers.

Thus, in the active region 32a, two n-channel transistors each including the gate electrode 40 and the source/drain regions 48 are formed.

The semiconductor device according to the present embodiment includes in the single active region 32a two n-channel transistors sharing one of the source/drain regions 48. The bottoms of the source/drain regions 48 of the n-channel transistors reach the device isolation insulating film 18, and the body regions (the p-wells 36) are isolated from each other by the n-well 34, the device isolation insulating film 18 and the source/drain regions 48.

In the respective active regions 32b, a p-type impurity region 50 as the contact layer to the p-well 36 is formed. Thus, the p-type impurity region 50 is electrically connected to the body region of the re-channel transistor via the p-well 36.

A metal silicide film 52 is formed on the gate electrodes 40 of the n-channel transistors, on the source/drain regions 48 and on the p-type impurity regions 50.

An inter-layer insulating film 54 is formed above the silicon substrate 10 with the n-channel transistors formed on. In the inter-layer insulating film 54, contact plugs 60 connected to the metal silicide film on the source/drain regions 48, contact plugs 62 connected to the metal silicide film on the gate electrodes 40 and the p-type impurity regions 50 are buried. The contact plugs 62 are shared contacts interconnecting the gate electrodes 40 and the p-type impurity regions 50.

As described above, in the semiconductor device according to the present embodiment, the bottoms of the source/drain regions 48 are in contact with the device isolation insulating film 18. The channel regions (the active regions 32a) of the transistors and the body contact regions (the active regions 32b) are isolated by the device isolation insulating film 32 and are not in direct contact with the p-type impurity regions 50 and the source/drain regions 48. Thus, the junction capacitance between the source/drain regions 48, and the p-wells 36 and the p-type impurity regions 50 can be drastically decreased, and the speediness and the low power consumption of the transistors can be achieved.

In the single active region 32a, the two re-channel transistors sharing one of the source/drain regions 48 are formed. The body regions of the two re-channel transistors can be isolated by the source/drain regions 48 and the device isolation insulating film 18 and do not have to be isolated by the device isolation insulating film 32. Thus, the placement pitch of the devices can be narrowed, and the integration can be improved.

One example of the circuits including two re-channel transistors sharing one of the source/drain regions is, e.g., CMOS NAND circuit.

Next, the method of manufacturing the semiconductor device according to the present embodiment will be described with reference to FIGS. 3 to 24B. FIGS. 3, 5, 7, 10, 12, 14, 16, 18, 20 and 23 are plan views illustrating the method of manufacturing the semiconductor device according to the present embodiment. FIGS. 4A, 4B, 6A, 6B, 8A, 8B, 9A, 9B, 11A, 11B, 13A, 13B, 15A, 15B, 17A, 17B, 19A, 19B, 21A, 21B, 22A, 22B, 24A and 24B are diagrammatic cross-sectional views illustrating the method of manufacturing the semiconductor device according to the present embodiment. FIGS.

4A, 6A, 8A, 9A, 11A, 13A, 15A, 17A, 19A, 21A, 22A and 24A are respectively the A-A' line cross-sectional view of FIG. 1. FIGS. 4B, 6B, 8B, 9B, 11B, 13B, 15B, 17B, 19B, 21B, 22B and 24B are respectively the B-B' line cross-sectional view of FIG. 1.

First, a silicon oxide film 12 of, e.g., an about 3-10 nm-thickness is formed above the silicon substrate 10 by, e.g., thermal oxidation method.

Next, a silicon nitride film 14 of, e.g., an about 70-10 nm-thickness is formed above the silicon oxide film 12 by, e.g., LPCVD method.

Next, the silicon nitride film 14 and the silicon oxide film 12 are patterned by photolithography and dry etching to be removed in the regions for the deep device isolation insulating film to be formed.

Figure 3:
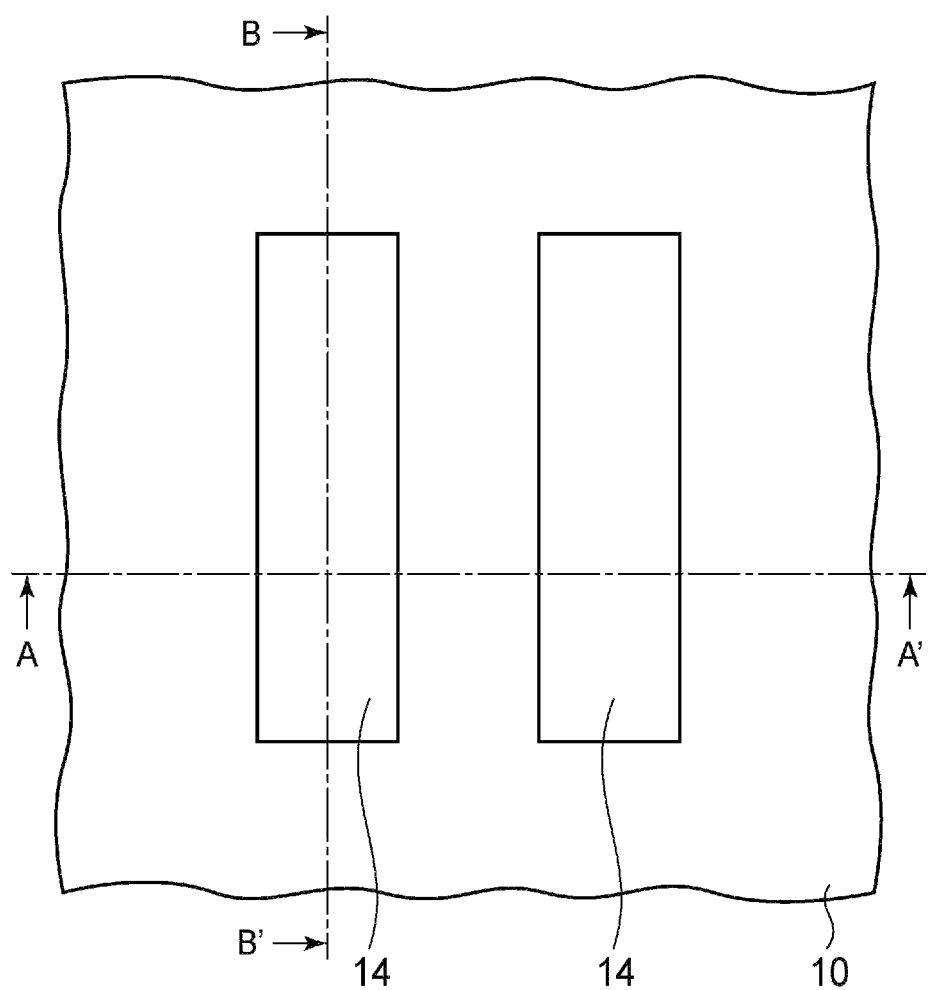
Figure 4A:
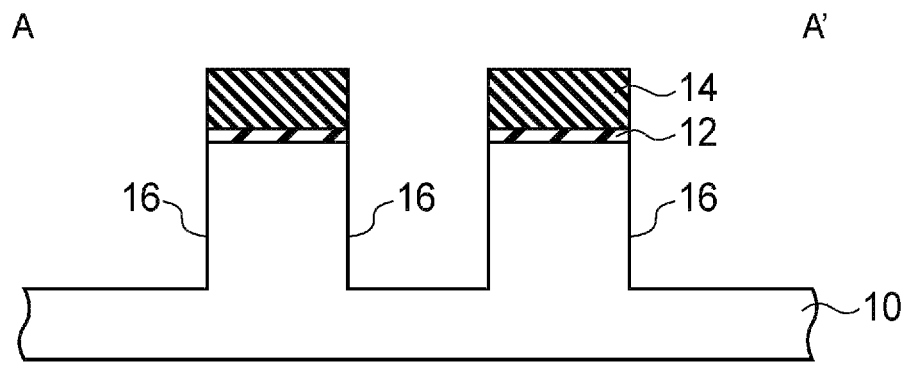
FIGS. 4A, 4B, 6A, 6B, 8A, 8B, 9A, 9B, 11A, 11B, 13A, 13B, 15A, 15B, 17A, 17B, 19A, 19B, 21A, 21B, 22A, 22B, 24A and 24B are diagrammatic cross-sectional views illustrating the method of manufacturing the semiconductor device according to the embodiment.
Figure 4B:
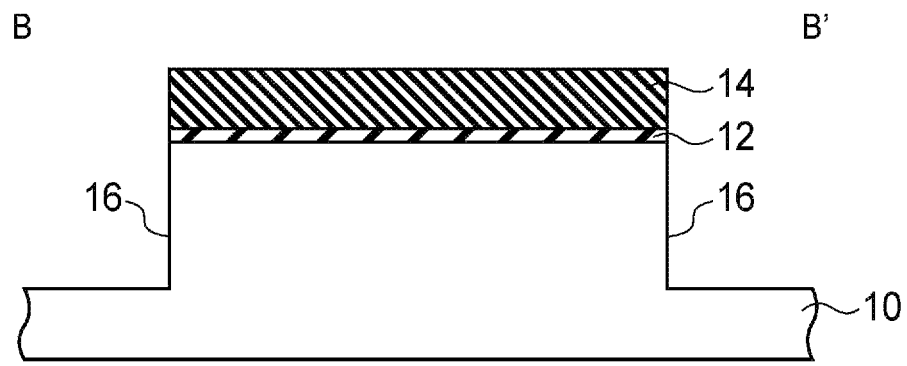

Next, the silicon substrate 10 is dry etched with the silicon nitride film 14 as the mask to form a device isolation trench 16 of, e.g., an about 300 nm-depth (FIGS. 3, 4A and 4B).

Next, a silicon oxide film (not illustrated) of an about 5 nm-thickness is formed on the side walls and the bottoms of the device isolation trench 16 by, e.g., thermal oxidation method.

Next, a silicon oxide film of, e.g., an about 450 nm-thickness is deposited above the entire surface by, e.g., high density plasma CVD method.

Next, the silicon oxide film above the silicon nitride film 14 is removed by, e.g., CMP (Chemical Mechanical Polishing) method. Thus, by the so-called STI (Shallow Trench Isolation) method, the device isolation insulating film 18 defining the active regions 20 of the silicon oxide film buried in the device isolation trench 16 is formed.

The active regions 20 are for defining the body regions formed from below the channel regions of the transistors to the body contact regions. For example, the active regions 20 in, e.g., the shape of a 100 nm-width stripe are formed at an 100 nm-interval.

Next, by, e.g., the silicon nitride film 14 is removed by wet etching using hot phosphoric acid.

Figure 6A:
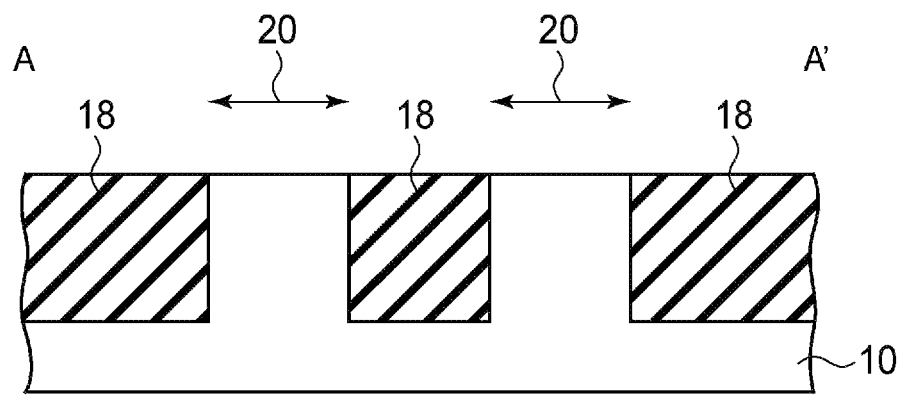
Figure 6B:
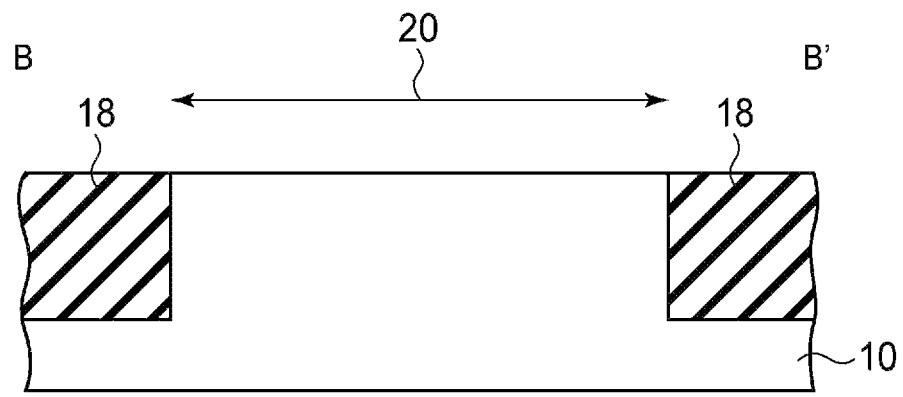

Next, the silicon oxide film 12 is removed by, e.g., wet etching using hydrofluoric acid aqueous solution while the device isolation insulating film 18 is etched to make the surface thereof even with the surface of the silicon substrate 10 (FIGS. 5, 6A and 6B).

Figure 7:
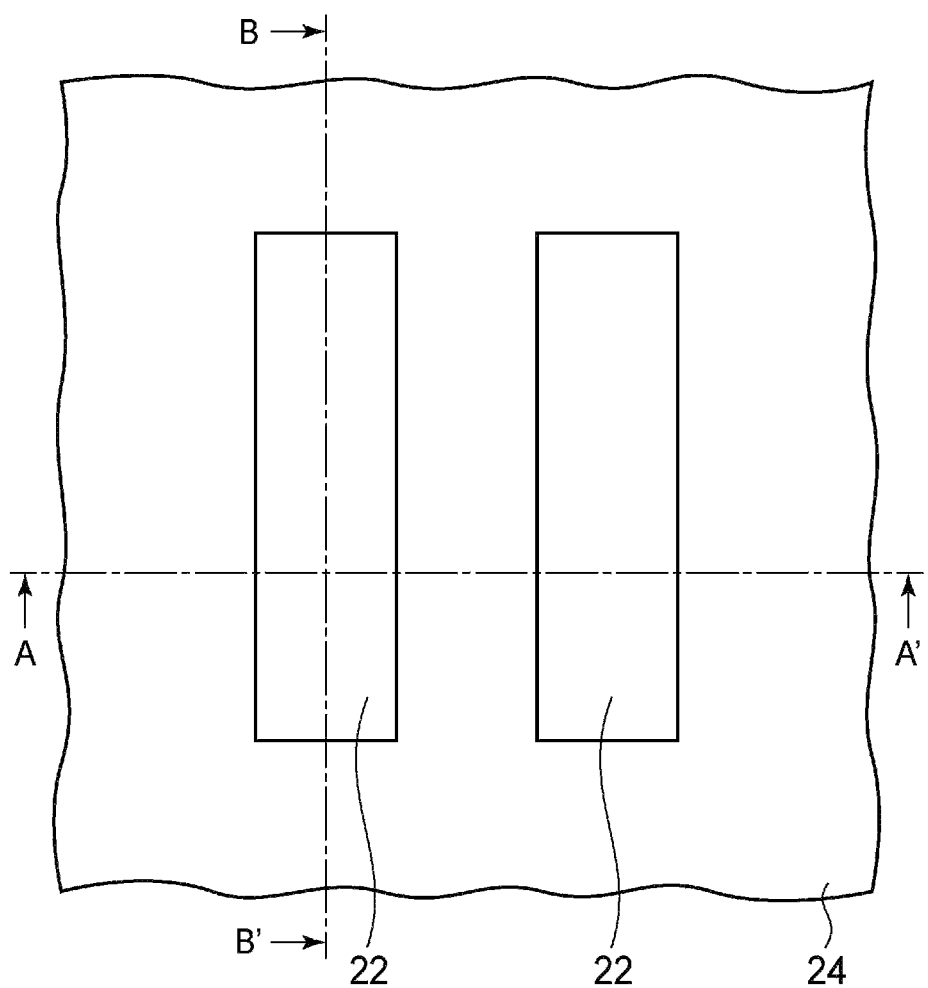
Figure 8A:
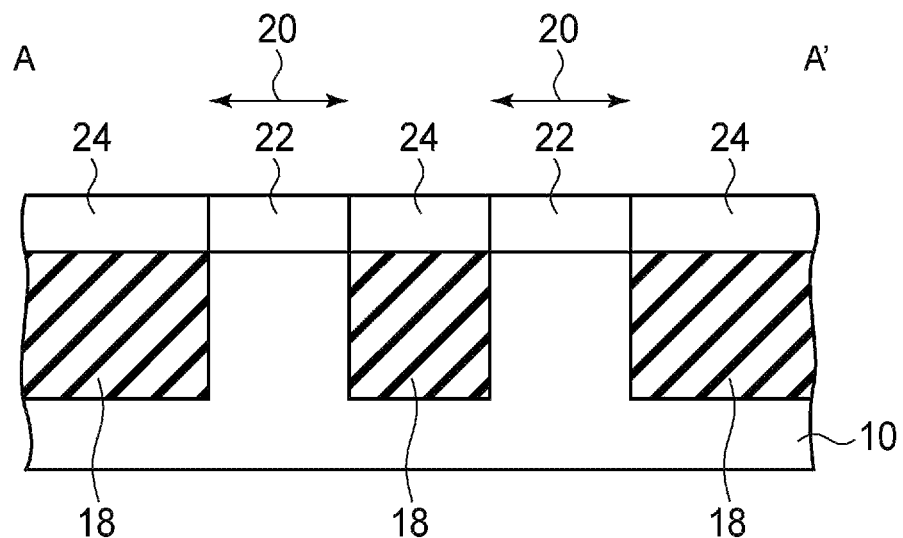
Figure 8B:
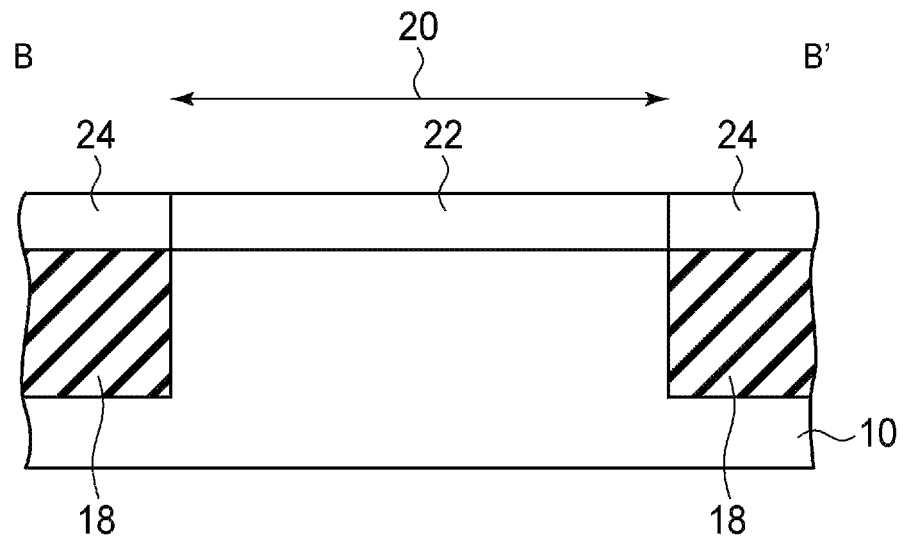
Figure 9A:
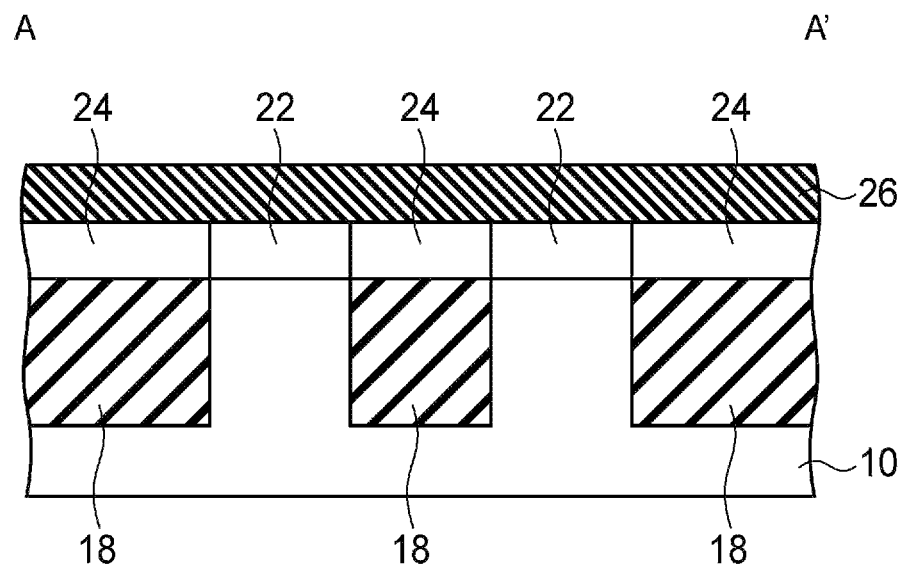
Figure 9B:
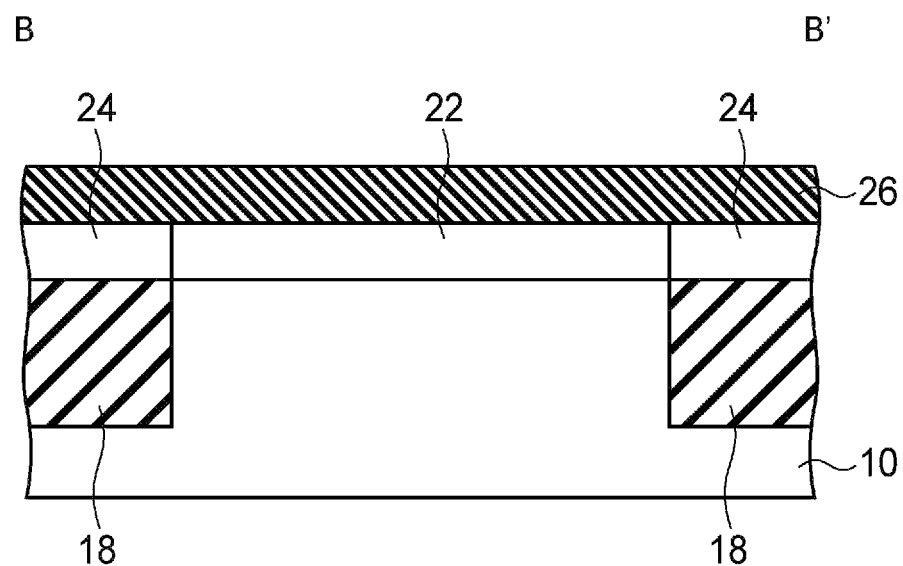

Then, a silicon film is grown above the entire surface by, e.g., LPCVD method. At this time, the single crystalline silicon film 22 epitaxially grows on the active regions 20 where the silicon substrate 10 is exposed, and the polycrystalline silicon film 24 grows on the device isolation insulating film 18 (FIGS. 7, 8A and 8B).

The silicon film is grown, e.g., by using $Si_2H_6$ or $SiH_4$ gas as the raw material gas, at 580° C.-700° C. of the growth temperature, preferably 650° C.-700° C. and under 20 Pa-100 Pa of the pressure for forming the single crystalline silicon film 22 and the polycrystalline silicon film 24. Thus, the single crystalline silicon film 22 is epitaxially grown selectively on the active regions 20, and the polycrystalline silicon film 24 is grown selectively on the device isolation insulating film 18. The film thickness of the single crystalline silicon film 22 and the film thickness of the polycrystalline silicon film 24 can be made substantially uniform.

Then, a silicon nitride film 26 of, e.g., an about 50 nm-thickness is formed above the entire surface by, e.g., LPCVD method (FIG. 9). A silicon oxide film may be formed between the silicon nitride film 26 and the silicon films 22, 24.

Figure 10:
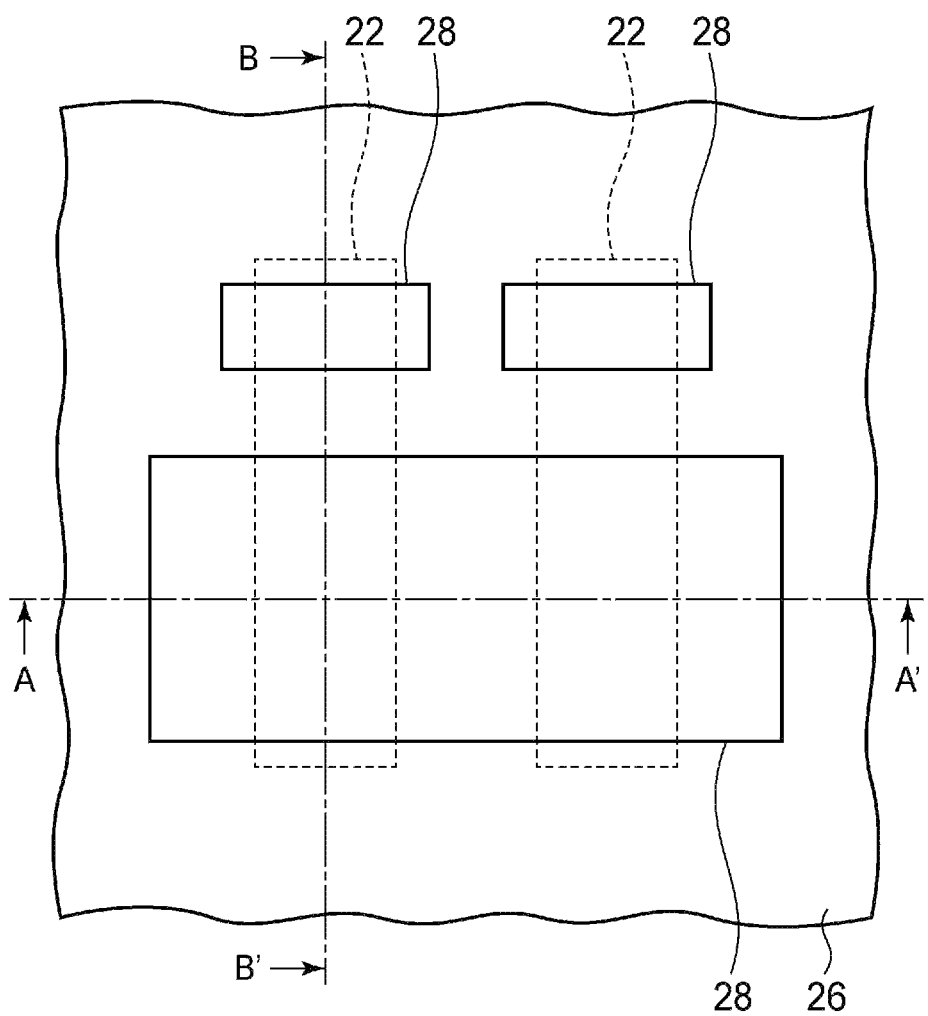
Figure 11A:
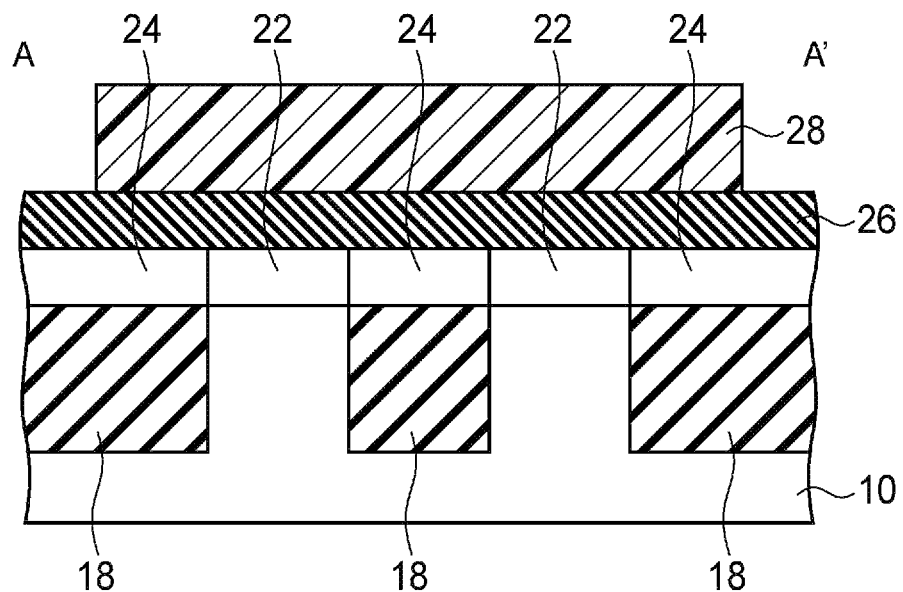
Figure 11B:
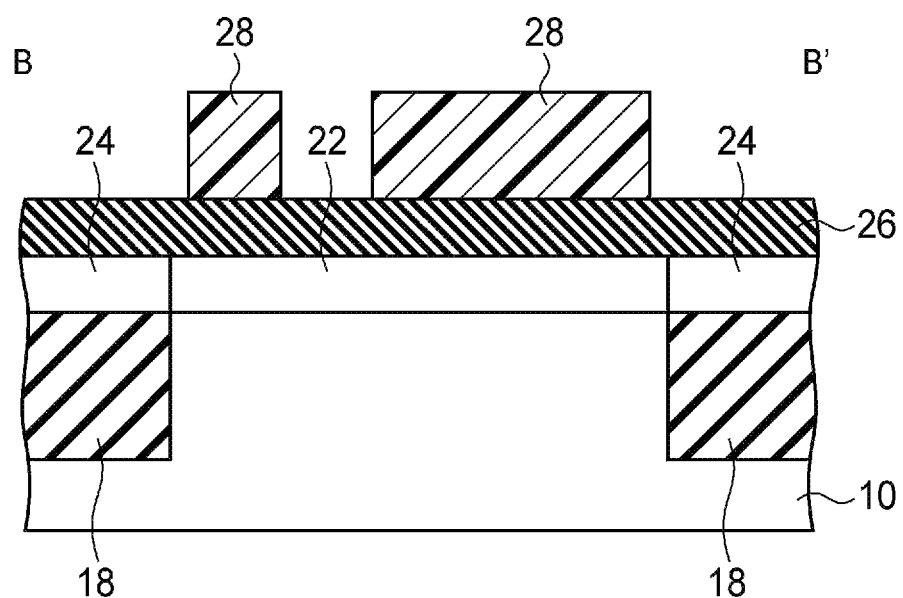

Next, a photoresist film 28 covering the regions for the active regions 32a, 32b to be formed in and exposing the regions for the device isolation insulating film 32 to be formed in is formed by photolithography (FIGS. 10, 11A and 11B).

Then, with the photoresist film 28 as the mask, the silicon nitride film 26 is dry etched to transfer the pattern of the photoresist film 28 to the silicon nitride film 26.

Figure 12:
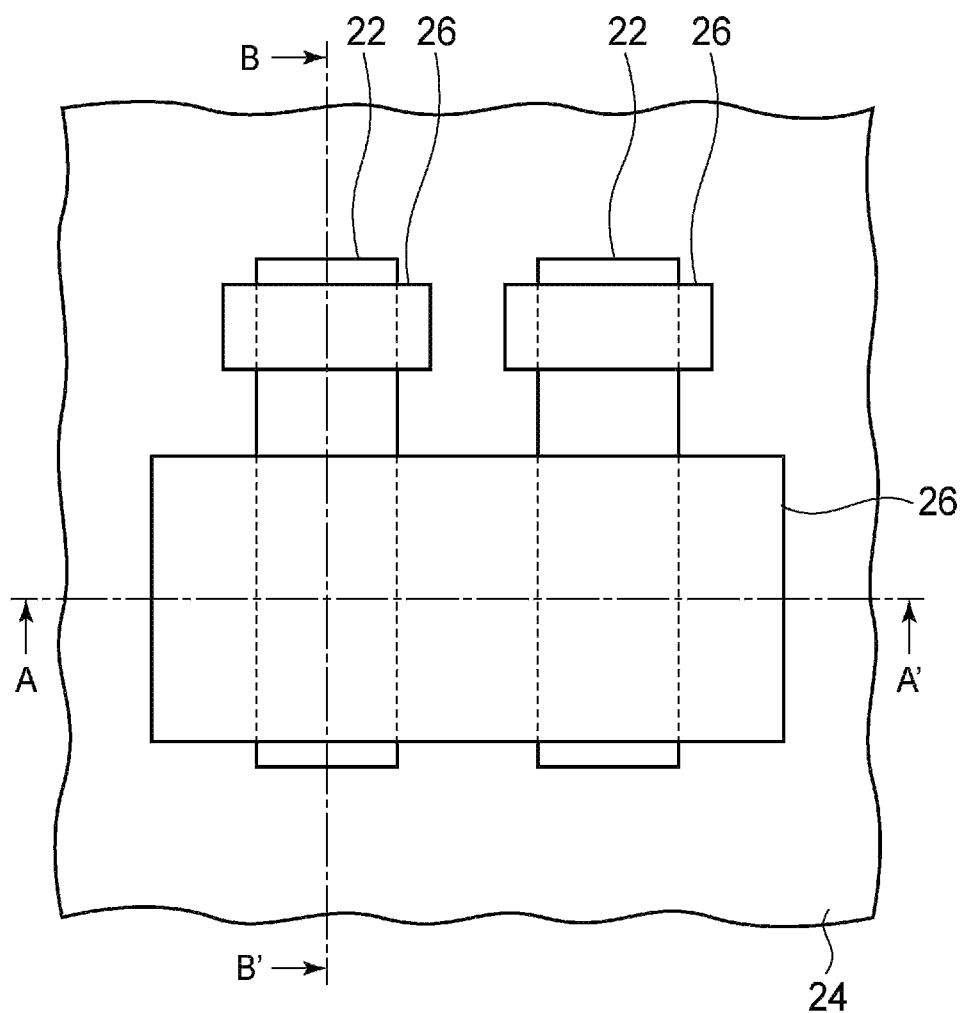
Figure 13A:
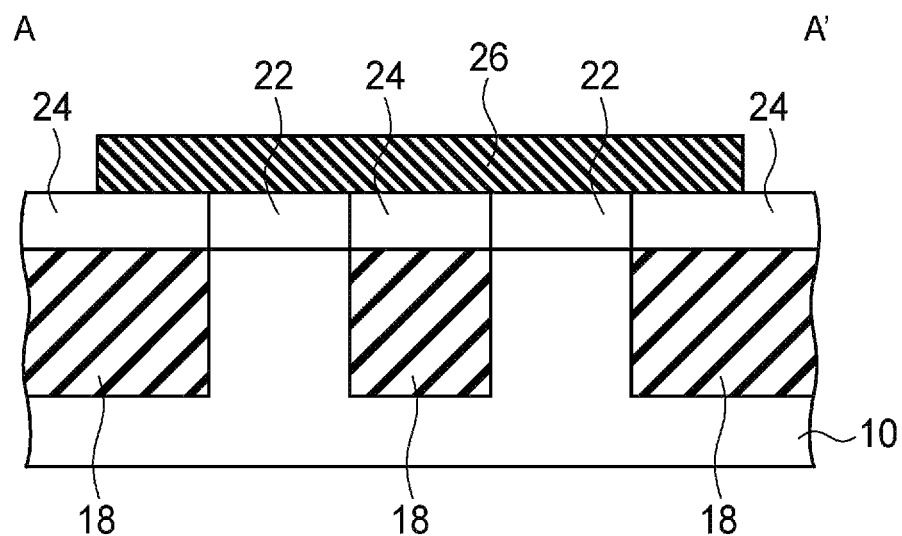
Figure 13B:
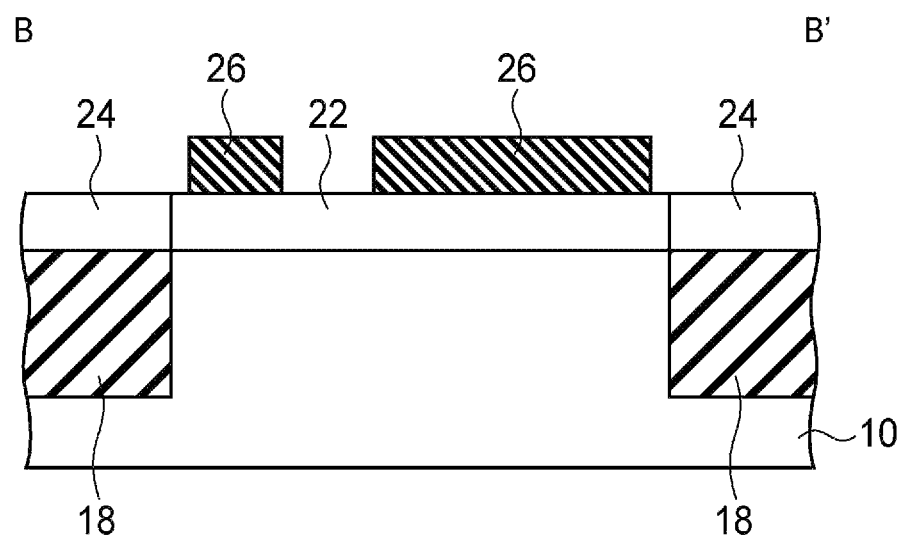

Next, the photoresist film 28 is removed by, e.g., asking method (FIGS. 12, 13A and 13B).

Figure 14:
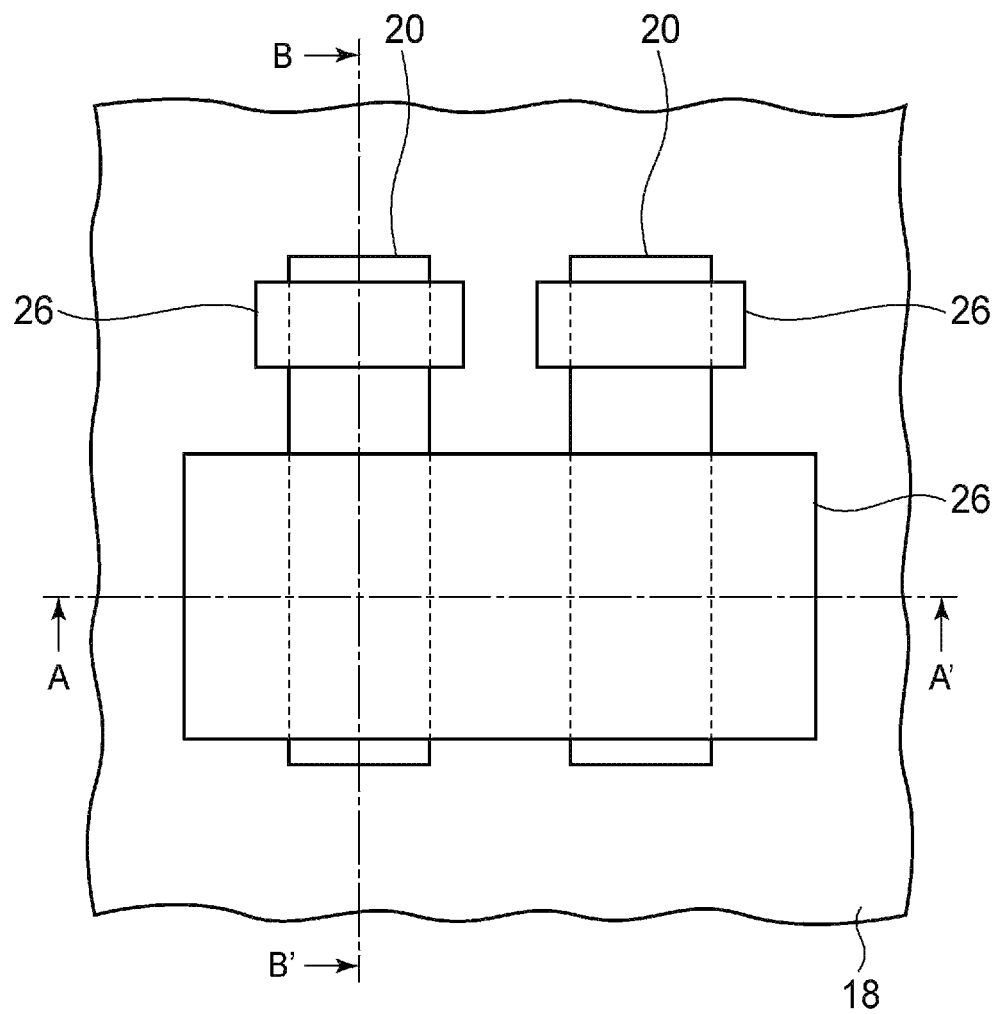
Figure 15A:
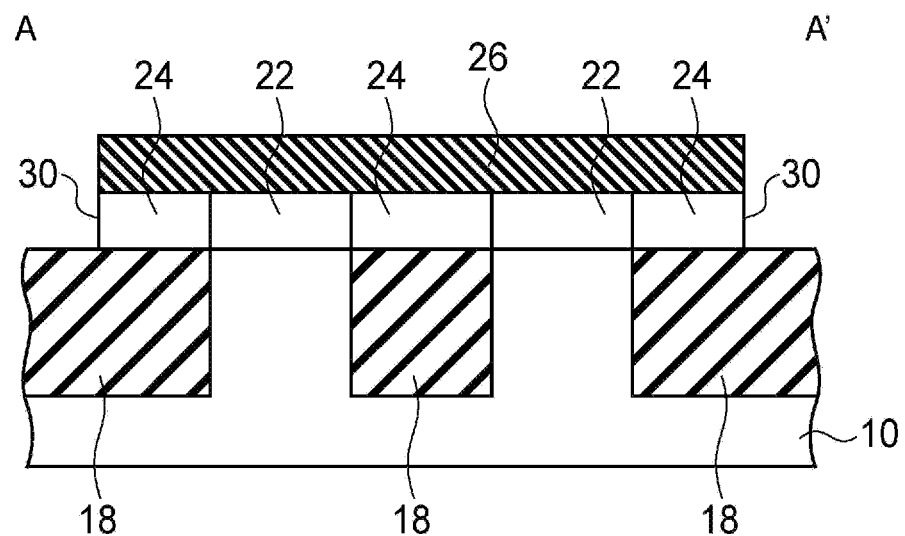
Figure 15B:
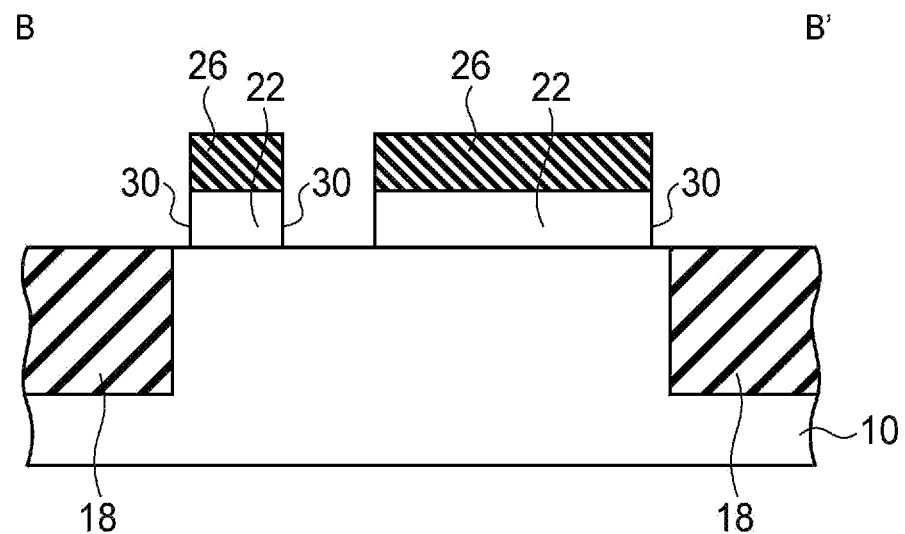

Then, the single crystalline silicon film 22 and the polycrystalline silicon film 24 are dry etched with the silicon nitride film 26 as the mask to remove the single crystalline silicon film 22 and the polycrystalline silicon film 24 in the regions for the device isolation insulating film 32 to be formed in. Thus, the device isolation trenches 30 for the device isolation insulating film 32 to be buried in are formed in the single crystalline silicon film 22 and the polycrystalline silicon film 24 (FIGS. 14, 15A and 15B).

Next, a silicon oxide film (not illustrated) of an about 5 nm-thickness is formed on the side walls and the bottoms of the device isolation trenches 30 by, e.g., thermal oxidation method.

Next, a silicon oxide film of an about 120 nm-thickness is deposited above the entire surface by, e.g., high density plasma CVD method.

Then, the silicon oxide film above the silicon nitride film 26 is removed by, e.g., CMP method. Thus, by STI method, the device isolation insulating film 32 of the silicon oxide film buried in the device isolation trenches 30 is formed. Thus, in the single crystalline silicon film 22 and the polycrystalline silicon film 24, the active region 32a and the active region 32b are defined.

The active regions 32a are the region where the channel regions and the source/drain regions 48 of transistors are formed. In the specification of the present application, this region where the channel regions and the source/drain regions of transistors are formed is often called a transistor forming region. The active regions 32b are regions where the body contact regions for leading out the electrodes form the body regions of the transistors are formed. The active regions 32b of a 100 nm-width spaced from the active region 32a by 100 nm, for example, are formed here.

Then, by, e.g., wet etching using hot phosphoric acid, the silicon nitride film 26 is removed.

Next, by, e.g., wet etching using hydrofluoric acid aqueous solution, the device isolation insulating film 32 is etched to make the surface thereof even with the surfaces of the single crystalline silicon film 22 and the polycrystalline silicon film 24.

Figure 16:
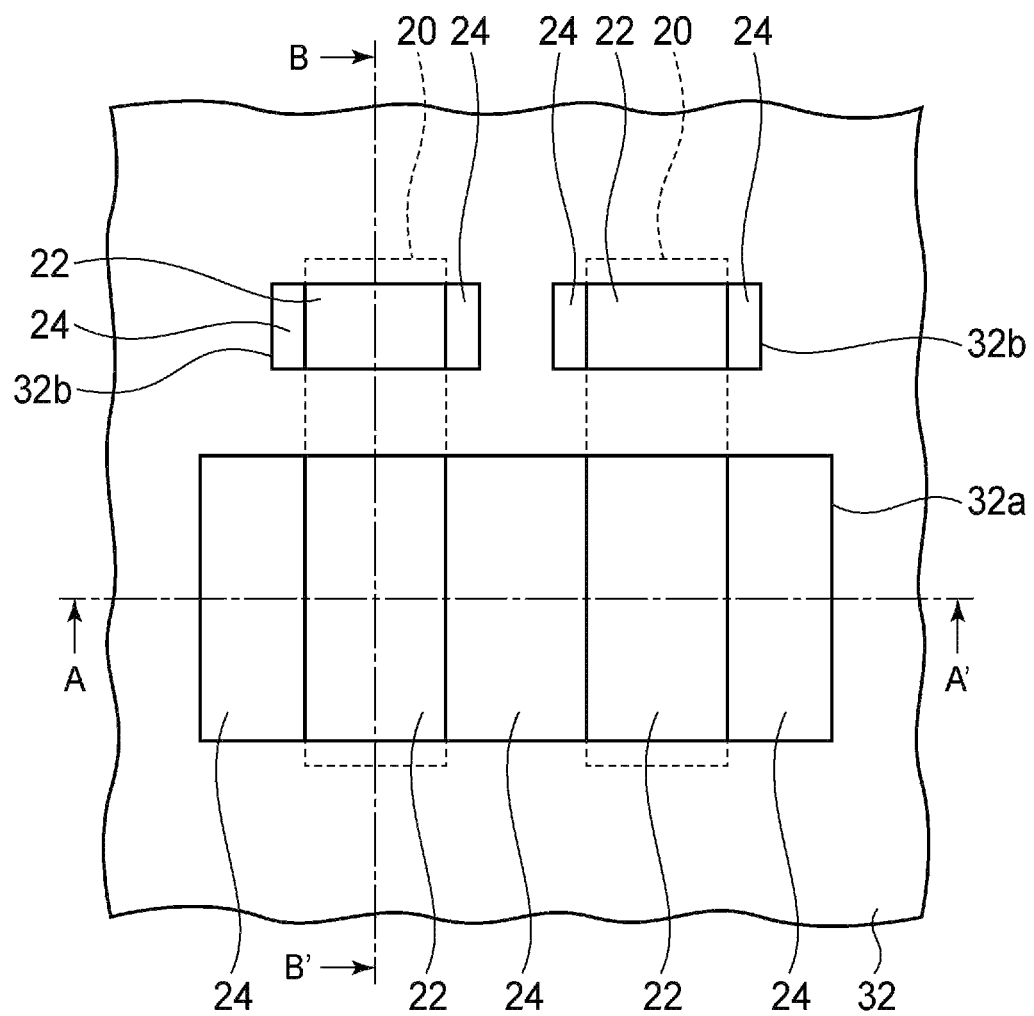
Figure 17A:
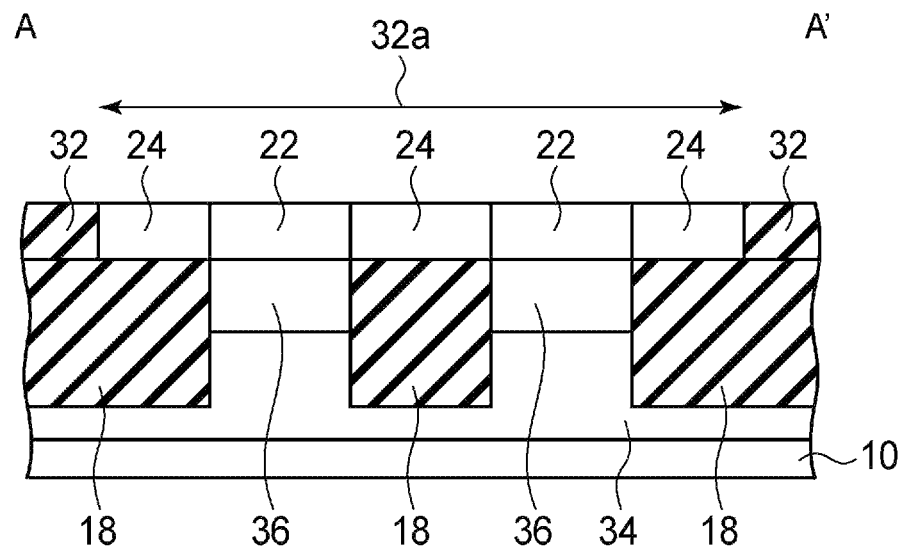
Figure 17B:
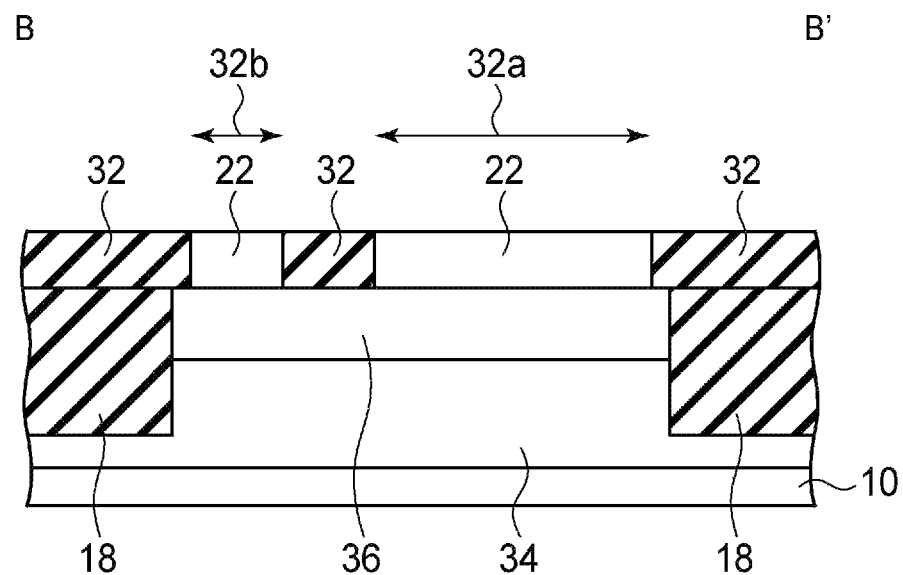

Next, the n-well 34 deeper than the bottom of the device isolation insulating film 18 is formed in the silicon substrate 10 by photolithography and ion implantation. In the silicon substrate 10 and the silicon films 22, 24, the p-wells 36 shallower than the bottom of the device isolation insulating film 18 are formed (FIGS. 16, 17A and 17B). The ion implantation for forming the p-wells 36 includes prescribed channel ion implantation. The n-well 34 and the p-wells 36 may be formed after the silicon films 22, 24 have been formed and before the device isolation insulating film 32 is formed.

Next, the surfaces of the single crystalline silicon film 22 and the polycrystalline silicon film 24 are thermally oxidized to form a gate insulating film 38 of silicon oxide film.

Next, a polycrystalline silicon film of, e.g., a 100 nm-thickness is formed on the gate insulating film 38 by, e.g., LPCVD method.

Figure 18:
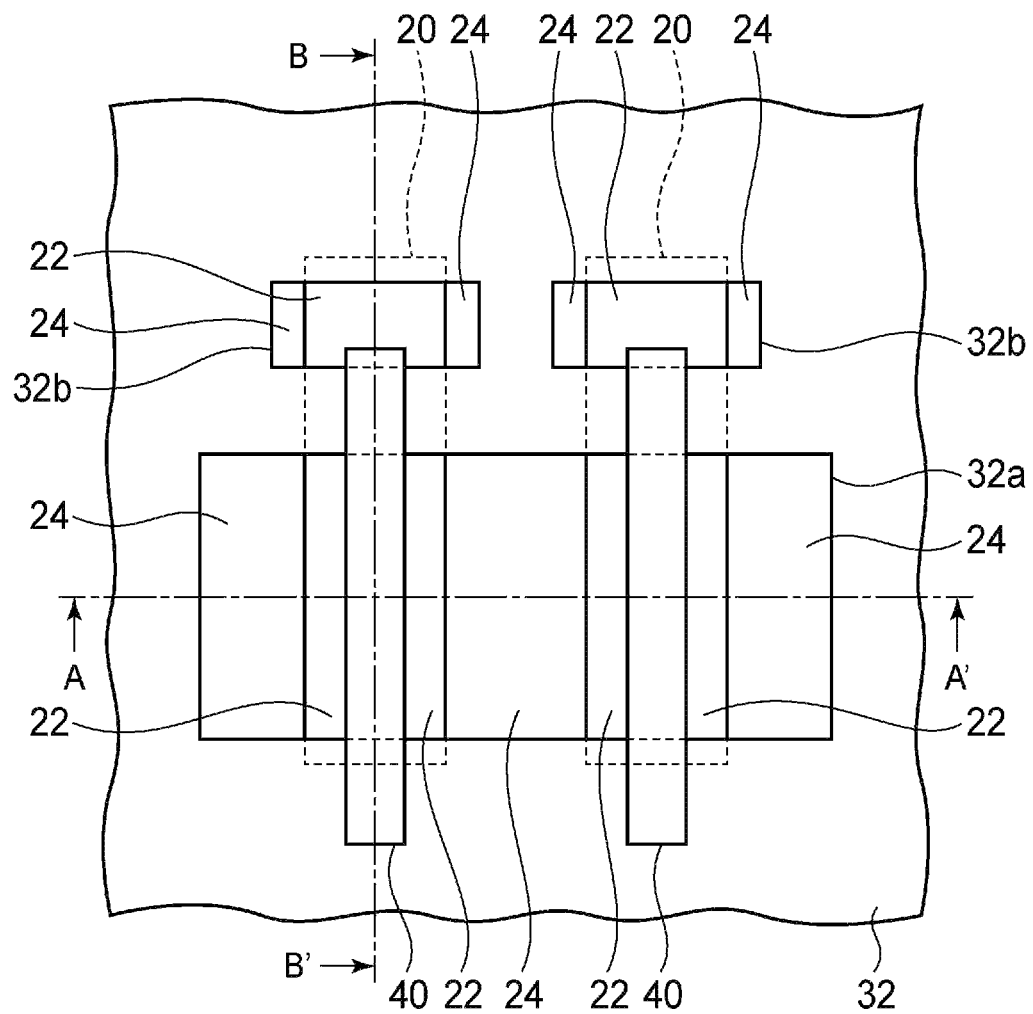
Figure 19A:
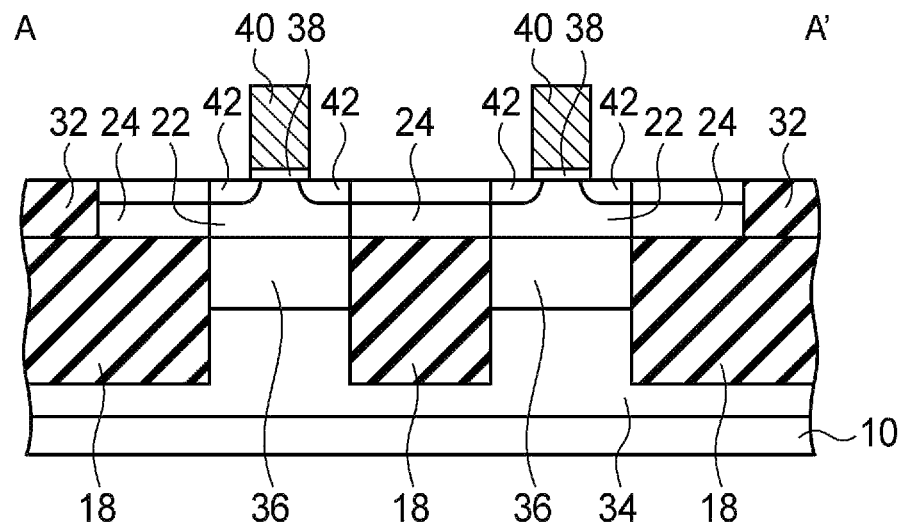
Figure 19B:
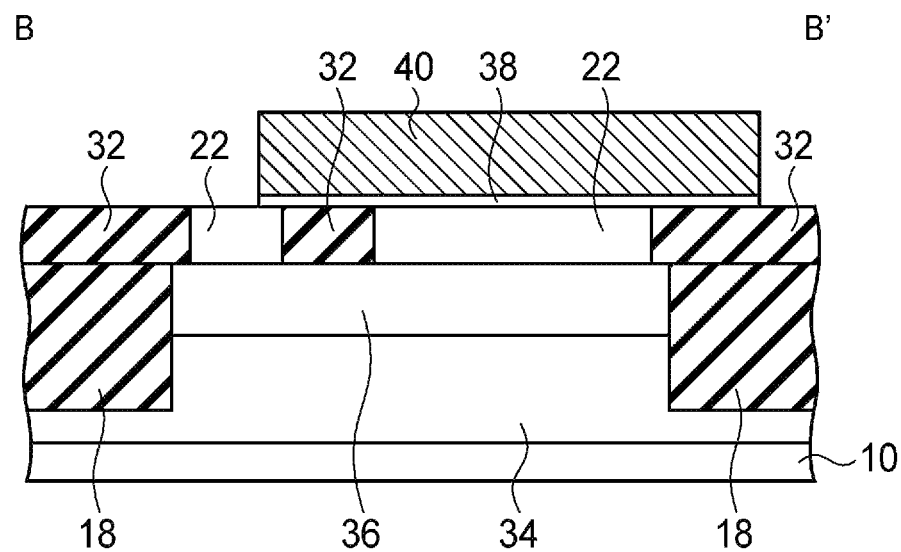

Next, the polycrystalline silicon film is patterned by photolithography and dry etching to form the gate electrodes 40 of polycrystalline silicon (FIGS. 18, 19A and 19B). The gate electrodes 40 of, e.g., a 50 nm-gate length are formed here.

In the present embodiment, the surfaces of the single crystalline silicon film 22 and the polycrystalline silicon film 24, and the surface of the device isolation insulating film 32 are even with each other, and the surface of the polycrystalline silicon film to be the gate electrodes 40 is substantially flat, which facilitates the patterning of the gate electrodes 40.

Then, ion implantation is made with the gate electrodes 40 as the mask to form in the active region 32a on both sides of the gate electrodes 40 an n-type impurity region 42 to be the extension regions. As required, p-type pocket regions may be formed together with the n-type impurity region 42.

Then, a silicon oxide film is deposited by, e.g., CVD method, and then, the silicon oxide film is anisotropically etched to form sidewall spacers 44 of the silicon oxide film on the side walls of the gate electrodes 40. The sidewall spacers 44 may be formed of another insulating material, such as silicon nitride or others.

Next, ion implantation is made with the gate electrodes 40 and the sidewall spacers 44 as the mask to form, in the active region 32a on both sides of the gate electrodes 40, n-type impurity regions 46 to be the source/drain regions 48 of the n-channel transistors together with the n-type impurity regions 42. At this time, the source/drain regions 48 are formed with the bottoms in contact with the device isolation insulating film 18, whereby the two n-channel transistors have the body regions isolated from each other but one of the source/drain regions 48 shorted.

Thus, above the silicon substrate 10, the re-channel transistors each including the gate electrode 40 and the source/drain regions 48 are formed.

Figure 20:
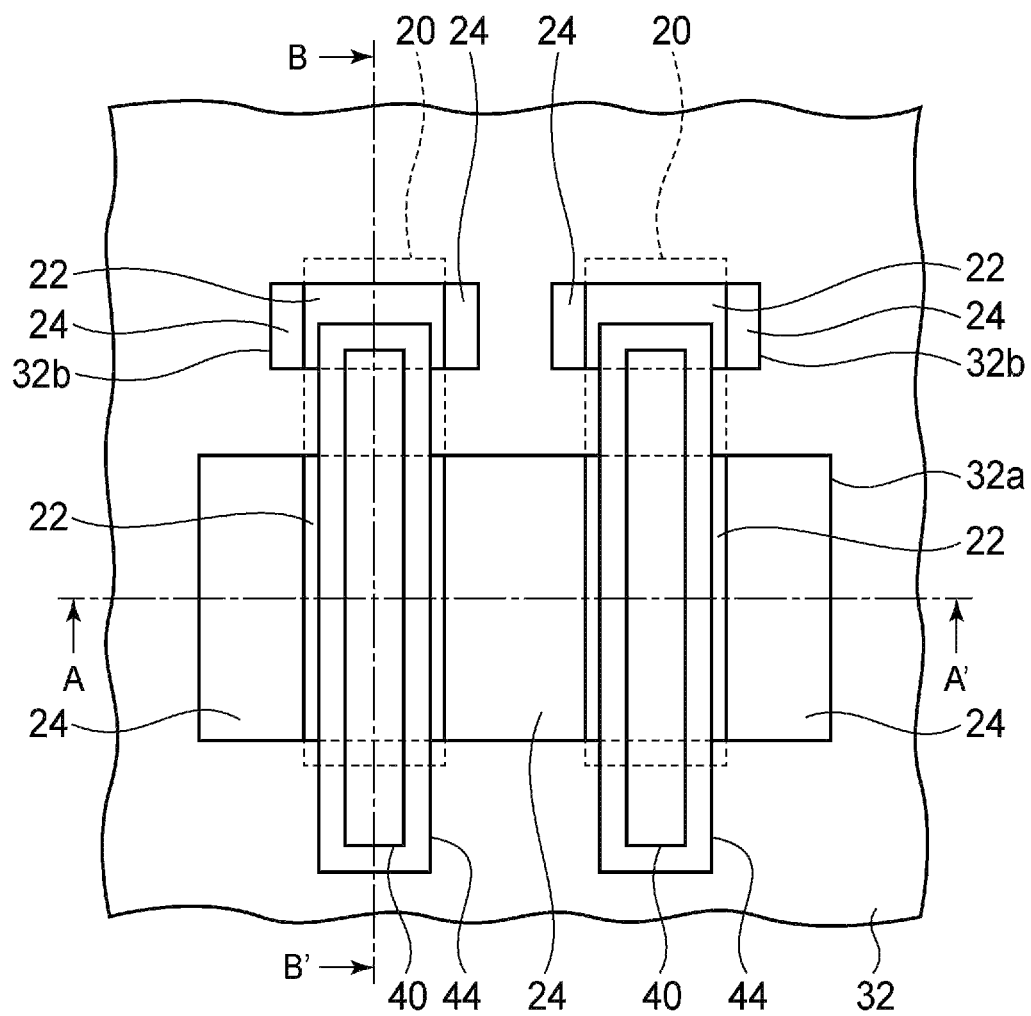
Figure 21A:
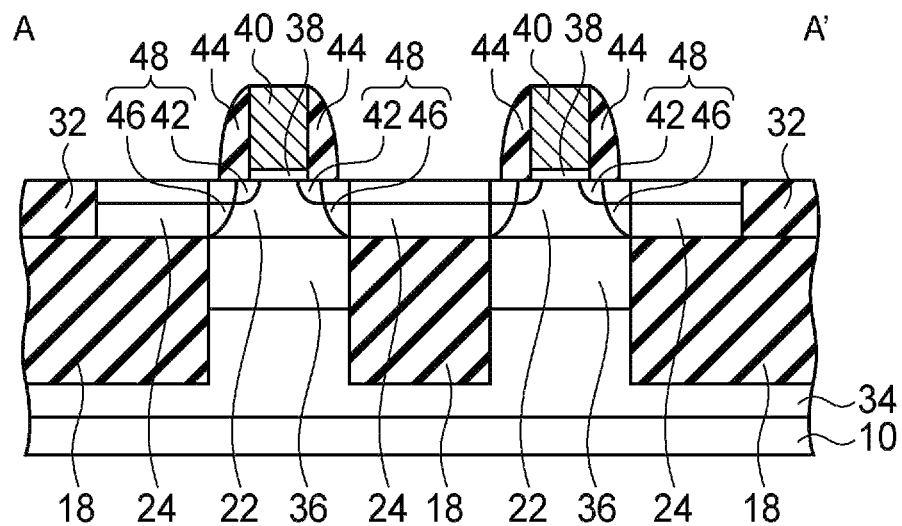
Figure 21B:
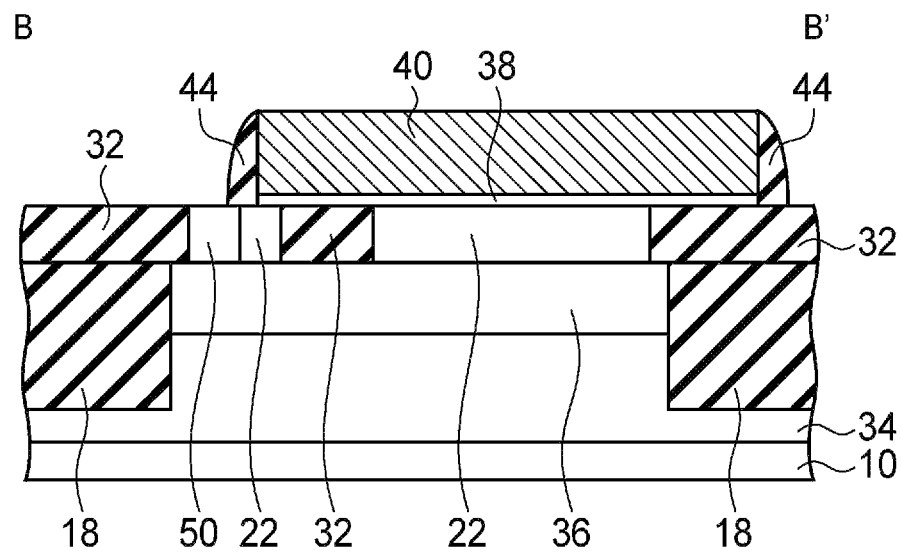

Next, by ion implantation, the p-type impurity regions 50 to be the body contact regions are formed in the active regions 32b (FIGS. 20, 21A and 21B).

Figure 22A:
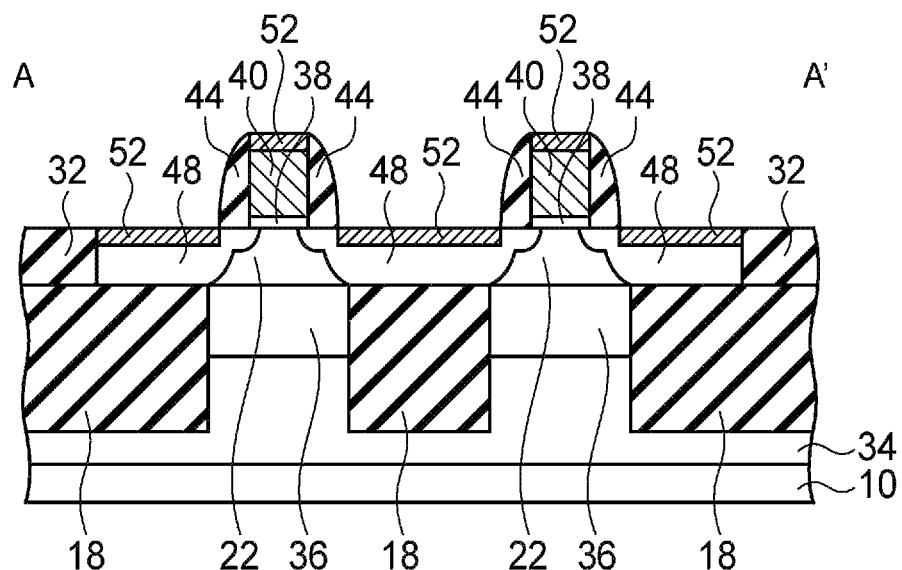
Figure 22B:
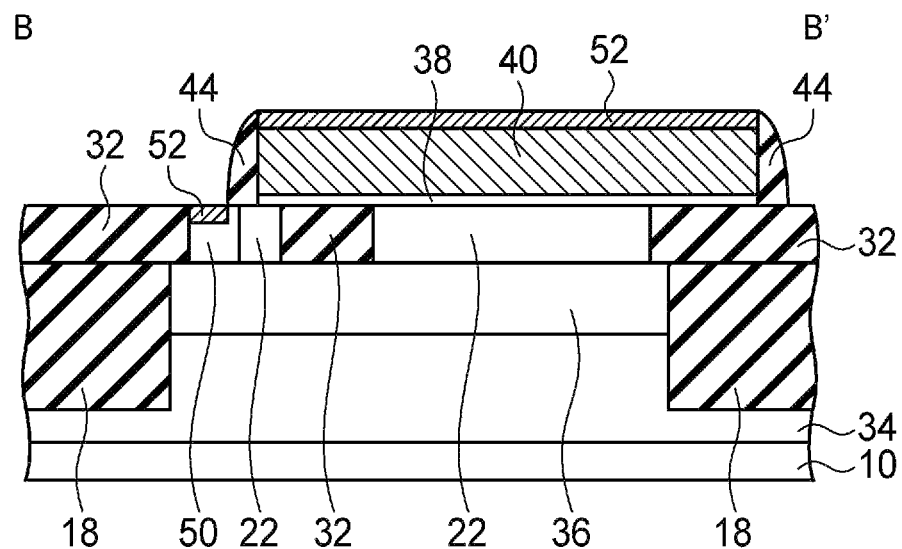

Next, a metal silicide film 52 is formed selectively on the source/drain regions 48, the gate electrodes 40 and the p-type impurity regions 50 by self-aligned silicide (silicide) process (FIGS. 22A and 22B). As the metal material forming the metal silicide film 52, titanium (Ti), cobalt (Co), nickel (Ni) or others can be used.

Next, an insulating film of silicon oxide film or others is deposited above the silicon substrate with the n-channel transistors formed on by, e.g., CVD method to form the inter-layer insulating film 54.

Next, the surface of the inter-layer insulating film 54 is planarized by, e.g., CMP method.

Then, the contact holes 56, 58 are formed in the inter-layer insulating film 54 by photolithography and dry etching. The contact holes 56 are formed down to the metal silicide film 52 on the source/drain regions 48. The contact holes 58 are formed in the region from the ends of the gate electrodes 48 to the p-type impurity region 50 down to the metal silicide film 52 on the gate electrodes 48 and the p-type impurity regions 50.

Figure 23:
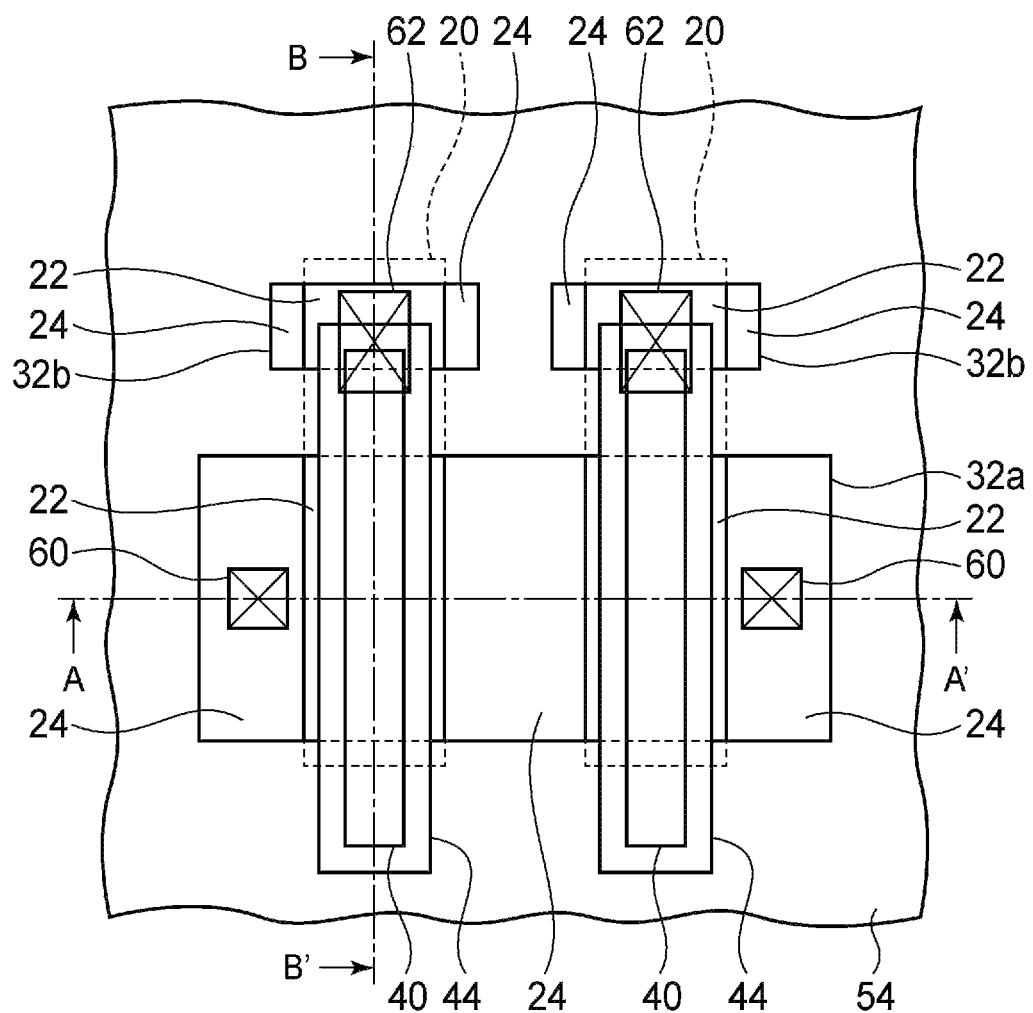
Figure 24A:
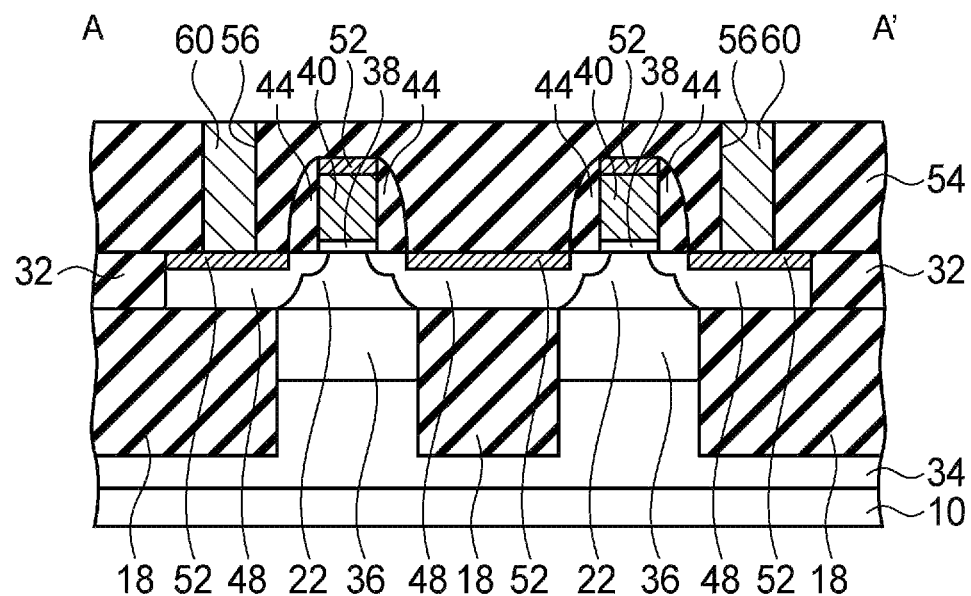
Figure 24B:
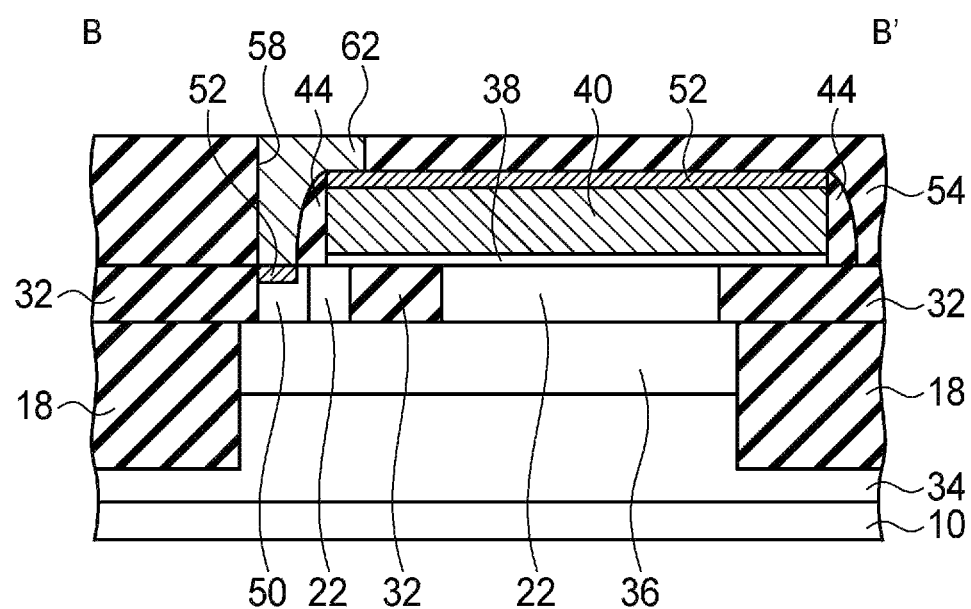

Next, a barrier metal and a tungsten film are deposited, and these conductive films are etched back to form the contact plugs 60 buried in the contact holes 56 and the contact plugs 62 buried in the contact holes 58 (FIGS. 23, 24A and 24B). The contact plugs 62 are shared contacts interconnecting the gate electrodes 48 and the p-well 36 (the body regions).

Then, above the inter-layer insulating film 54 with the contact plugs 60, 62 buried in, required interconnection layers, etc., are formed, and the semiconductor device according to the present embodiment is completed.

As described above, according to the present embodiment, the channel region and the body contact region are isolated by the shallow device isolation insulating film, whereby the direct contact between the source/drain region and the contact region of the body contact region can be prevented the bottoms of the source/drain regions 48 are in contact with the device isolation insulating film, whereby the junction capacitance between the source/drain regions, and the well and the contact region can be drastically decreased, and the speediness and the low power consumption of the transistor can be realized.

Two n-channel transistors sharing one of the source/drain regions are formed in one active region, and the body regions of these transistors are isolated by the source/drain regions, whereby the placement pitch of the transistors can be narrowed, and the integration can be improved.

Modified Embodiments

The above-described embodiment can cover other various modifications.

For example, in the above-described embodiment, the semiconductor device including n-channel DTMOS is described. The above-described embodiment is the same with the semiconductor device including p-channel DTMOS, and in the p-channel DTMOS, the conduction types of the respective layers are opposite to those of the n-channel DTMOS.

In the above-described embodiment, two n-channel transistors sharing one of the source/drain regions 48 are formed in the active region 32a. However, the source/drain regions 48 may not be essentially shared, and the respective transistors may be formed in discrete active regions 32a.

Figure 25:
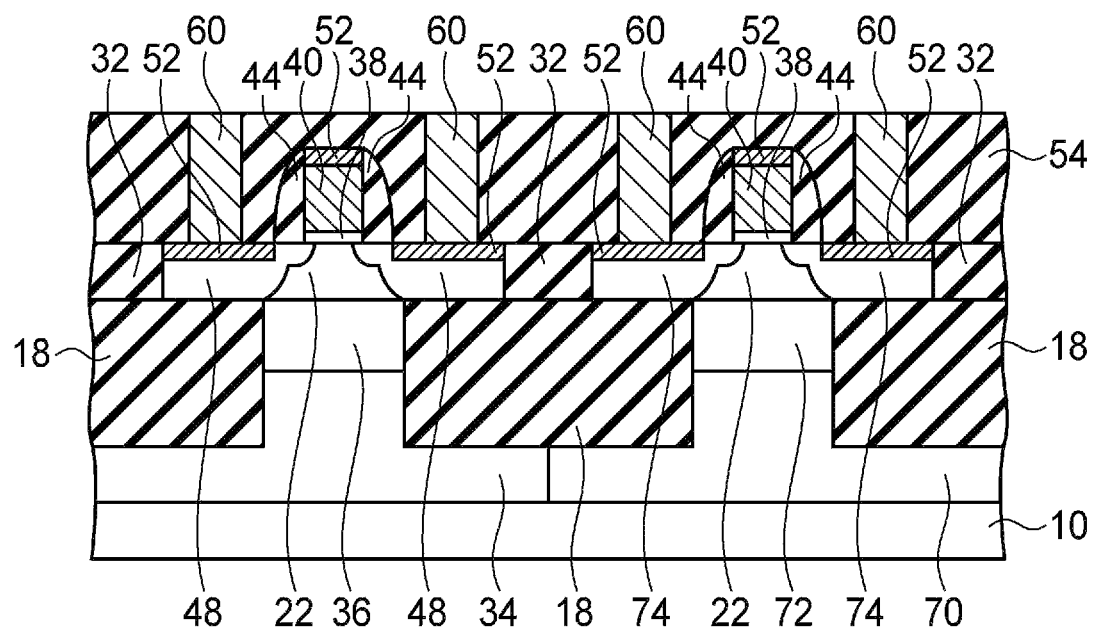
FIG. 25 is a diagrammatic cross-sectional view illustrating a structure of a semiconductor device according to a modification the embodiment.

In this case, as exemplified in FIG. 25, the two transistor forming regions are isolated from each other by the device isolation insulating film 32. The source/drain regions 48 is not essentially in contact with the device isolation insulating film 18.

FIG. 25 illustrates the example that an re-channel DTMOS and a p-channel DTMOS are formed adjacent to each other. The p-channel DTMOS includes, e.g., a p-well 70, an n-well 72 and the p-type source/drain regions 74. The gate electrode 48 of the p-channel DTMOS is formed of, e.g., $P^+$-type polycrystalline silicon.

In the above-described embodiment, two transistors are formed adjacent to each other, but two transistors may are not essentially formed. Only 1 transistor may be formed, or 3 or more transistors may be formed.

In the above-described embodiment, the metal silicide film 52 is formed on the surfaces of the source/drain regions 48, but the regions of the source/drain regions 48, which are in contact with the device isolation insulating film 18 may be silicided.

The semiconductor device according to the present embodiment, in which the source/drain regions 48 are formed in the polycrystalline silicon film 24, has a higher resistance value in comparison with that of the semiconductor device with the source/drain regions formed in the single crystalline silicon. The source/drain regions 48 are silicided down to the bottom, whereby the resistance increase due to the polycrystalline silicon film 24 can be compensated.

In the above-described embodiment, the body regions of the respective transistors are isolated from each other by using the double wells. In the case that another isolation means is used, for example, the transistors are formed on an SOI substrate, or others, the body regions may not be essentially formed in the double wells.

The structure, the constituent materials, the manufacturing conditions, etc. of the semiconductor device described in the above-described embodiment are only one example and can be suitably modified or changed in accordance with technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first device isolation insulating film defining a first region in a semiconductor substrate;
   a first conductive layer of a first conductivity type formed in the first region of the semiconductor substrate;
   a semiconductor layer formed above the semiconductor substrate and including
      a second conductive layer of the first conductivity type formed in a second region, which is a first part of the first region, connected to the first conductive layer, and
      a third conductive layer of the first conductivity type in a third region, which is a second part of the first region, connected to the first conductive layer;
   a second device isolation insulating film formed in the semiconductor layer and isolating the second conductive layer and the third conductive layer from each other, a bottom of the second device isolation insulating film being in contact with the first conductive layer and shallower than a bottom of the first device isolation insulating film;
   a gate insulating film formed above the second conductive layer;
   a gate electrode formed above the gate insulating film; and
   a conductive plug formed above the third conductive layer and the gate electrode, the third conductive layer being electrically connected to the gate electrode via the conductive plug, the gate electrode being electrically connected to the first conductive layer via the third conductive layer.

2. The semiconductor device according to claim 1, wherein the semiconductor layer further includes a source/drain regions of a second conductivity type arranged, sandwiching the second conductive layer and having bottoms in contact with the first device isolation insulating film.

3. The semiconductor device according to claim 2, wherein the semiconductor layer includes a single crystalline semiconductor region and a polycrystalline semiconductor region, and
the source/drain regions are formed in the polycrystalline semiconductor region.

4. The semiconductor device according to claim 1, wherein a surface of the semiconductor layer and a surface of the second device isolation insulating film are even with each other.

5. The semiconductor device according to claim 1, wherein the first conductive layer is shallower than a bottom of the first device isolation insulating film.

6. The semiconductor device according to claim 1, wherein a fourth conductive layer formed in the semiconductor substrate below the first conductive layer and being deeper than a bottom of the first device isolation insulating film.

7. A semiconductor device comprising:
   a first device isolation insulating film defining a first region and a second region in a semiconductor substrate;
   a first conductive layer of a first conductivity type formed in the first region of the semiconductor substrate and being shallower than a bottom of the first device isolation insulating film;
   a second conductive layer of the first conductivity type formed in the second region of the semiconductor substrate and being shallower than the bottom of the first device isolation insulating film;
   a third conductive layer of a second conductivity type formed in the semiconductor substrate below the first conductive layer and the second conductive layer and being deeper than the bottom of the first device isolation insulating film;
   a semiconductor layer formed above the semiconductor substrate and including
      a fourth conductive layer of the first conductivity type formed in a third region, which is a first part of the first region, electrically connected to the first conductive layer,
      a fifth conductive layer of the first conductivity type formed in a fourth region, which is a second part of the second region, electrically connected to the second conductive layer,
      a sixth conductive layer of the first conductivity type formed in a fifth region, which is a third part of the first region, electrically connected to the first conductive layer,
      a seventh conductive layer of the first conductivity type formed in a sixth region, which is a fourth part of the second region, electrically connected to the second conductive layer, and
      an eighth conductive layer of the second conductivity type formed in a seventh region between the third region and the fourth region in contact with the first device isolation insulating film;
   a second device isolation insulating film formed in the semiconductor layer and isolating the sixth conductive layer and the fourth conductive layer, and isolating the seventh conductive layer and the fifth conductive layer, a bottom of the second device isolation insulating film being in contact with the first conductive layer and shallower than a bottom of the first device isolation insulating film;
   a first gate insulating film formed above the fourth conductive layer;
   a second gate insulating film formed above the fifth conductive layer;
   a first gate electrode formed above the first gate insulating film;
   a first conductive plug formed above the sixth conductive layer and the first gate electrode, the sixth conductive layer being electrically connected to the first gate electrode via the first conductive plug, the first gate electrode being electrically connected to the first conductive layer via the sixth conductive layer;
   a second gate electrode formed above the second gate insulating film;
   a second conductive plug formed above the seventh conductive layer and the second gate electrode, the seventh conductive layer being electrically connected to the second gate electrode via the second conductive plug, the second gate electrode being electrically connected to the second conductive layer via the seventh conductive layer.

8. The semiconductor device according to claim 7, wherein
the semiconductor layer includes a single crystalline semiconductor region and a polycrystalline semiconductor region, and
the eighth conductive layer is formed in the polycrystalline semiconductor region.

9. The semiconductor device according to claim 7, wherein
a surface of the semiconductor layer and a surface of the second device isolation insulating film are even with each other.

\* \* \* \* \*